United States Patent
Yoshida et al.

(10) Patent No.: US 9,685,920 B2
(45) Date of Patent: Jun. 20, 2017

(54) RECONFIGURABLE OPERATIONAL AMPLIFIER

(71) Applicant: TAIYO YUDEN CO., LTD., Tokyo (JP)

(72) Inventors: Hideaki Yoshida, Tokyo (JP); Mitsunori Katsu, Tokyo (JP); Hiroyuki Kozutsumi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 14/939,060

(22) Filed: Nov. 12, 2015

(65) Prior Publication Data
US 2016/0142017 A1 May 19, 2016

(30) Foreign Application Priority Data
Nov. 13, 2014 (JP) .................................. 2014-230391

(51) Int. Cl.
*H03F 3/45* (2006.01)
*H03F 1/34* (2006.01)

(52) U.S. Cl.
CPC ... *H03F 3/45475* (2013.01); *H03F 2200/261* (2013.01); *H03F 2203/45116* (2013.01); *H03F 2203/45118* (2013.01); *H03F 2203/45138* (2013.01); *H03F 2203/45526* (2013.01); *H03F 2203/45528* (2013.01); *H03F 2203/45534* (2013.01); *H03F 2203/45551* (2013.01); *H03F 2203/45616* (2013.01); *H03F 2203/45701* (2013.01); *H03F 2203/45726* (2013.01)

(58) Field of Classification Search
CPC ..................................... H03F 1/34; H03F 3/45
USPC ....................................................... 330/69, 86
See application file for complete search history.

(56) References Cited

U.S. PATENT DOCUMENTS 5,285,169 A * 2/1994 Theus ................. H03F 3/45183
330/254
6,150,838 A 11/2000 Wittig et al.
6,208,163 B1 3/2001 Wittig et al.

FOREIGN PATENT DOCUMENTS

JP 2002-538652 A 11/2002
WO 00/51239 A1 8/2000

* cited by examiner

*Primary Examiner* — Steven J Mottola
(74) *Attorney, Agent, or Firm* — Chen Yoshimura LLP

(57) ABSTRACT

A reconfigurable operational amplifier includes: a first signal input terminal; a second signal input terminal; an output terminal; an operational amplifier having a non-inverting input, an inverting input, and an output; a negative feedback circuit path from the output of the operational amplifier to the inverting input of the operational amplifier; a first input circuit path from the first signal input terminal to the non-inverting input of the operational amplifier; a second input circuit path from the second signal input terminal to the inverting input of the operational amplifier; an output circuit path from the output of the operational amplifier to the output terminal; and logic units, wherein one or more of the logic units are provided in at least one of the negative feedback circuit path, the first input circuit path, the second input circuit path, and the output circuit path.

15 Claims, 33 Drawing Sheets

TABLE 2A

| SW | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Select | on | off | off | on | off | off | off | on | off | off | on | off | off | on | on |

TABLE 2B

| SW | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Select | on | off | off | on | off | off | on | off | off | off | on | off | off | on | on |

TABLE 2C

| SW | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Select | off | on | off | on | off | off | off | on | off | off | on | off | off | on | on |

TABLE 2D

| SW | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Select | off | off | off | off | off | on | off | off | on | off | off | off | off | on | on |

TABLE 2E

| SW | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Select | on | off | off | on | off | off | off | on | off | on | off | on | off | on | on |

TABLE 2F

| SW | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| Select | on | off | on | off | off | off | off | on | off | off | on | off | off | on | on |

| A0 | A1 | A2 | A3 | D0 | D1 | D2 | D3 |
|---|---|---|---|---|---|---|---|
| 0 | 0 | 0 | 0 | 0 | * | * | * |
| 1 | 0 | 0 | 0 | 1 | * | * | * |
| 0 | 1 | 0 | 0 | 1 | * | * | * |
| 1 | 1 | 0 | 0 | 1 | * | * | * |
| 0 | 0 | 1 | 0 | 0 | * | * | * |
| 1 | 0 | 1 | 0 | 1 | * | * | * |
| 0 | 1 | 1 | 0 | 1 | * | * | * |
| 1 | 1 | 1 | 0 | 1 | * | * | * |
| 0 | 0 | 0 | 1 | 0 | * | * | * |
| 1 | 0 | 0 | 1 | 1 | * | * | * |
| 0 | 1 | 0 | 1 | 1 | * | * | * |
| 1 | 1 | 0 | 1 | 1 | * | * | * |
| 0 | 0 | 1 | 1 | 1 | * | * | * |
| 1 | 0 | 1 | 1 | 1 | * | * | * |
| 0 | 1 | 1 | 1 | 1 | * | * | * |
| 1 | 1 | 1 | 1 | 1 | * | * | * |

FIG. 17

| A0 | A1 | A2 | A3 | D0 | D1 | D2 | D3 |
|---|---|---|---|---|---|---|---|
| 0 | 0 | 0 | 0 | 0 | 0 | 0 | 0 |
| 1 | 0 | 0 | 0 | 0 | 1 | 0 | 0 |
| 0 | 1 | 0 | 0 | 0 | 0 | 1 | 0 |
| 1 | 1 | 0 | 0 | 0 | 1 | 1 | 0 |
| 0 | 0 | 1 | 0 | 0 | 0 | 0 | 1 |
| 1 | 0 | 1 | 0 | 0 | 1 | 0 | 1 |
| 0 | 1 | 1 | 0 | 0 | 0 | 1 | 1 |
| 1 | 1 | 1 | 0 | 0 | 1 | 1 | 1 |
| 0 | 0 | 0 | 1 | 1 | 0 | 0 | 0 |
| 1 | 0 | 0 | 1 | 1 | 1 | 0 | 0 |
| 0 | 1 | 0 | 1 | 1 | 0 | 1 | 0 |
| 1 | 1 | 0 | 1 | 1 | 1 | 1 | 0 |
| 0 | 0 | 1 | 1 | 1 | 0 | 0 | 1 |
| 1 | 0 | 1 | 1 | 1 | 1 | 0 | 1 |
| 0 | 1 | 1 | 1 | 1 | 0 | 1 | 1 |
| 1 | 1 | 1 | 1 | 1 | 1 | 1 | 1 |

FIG. 19

| A0 | A1 | A2 | A3 | D0 | D1 | D2 | D3 |
|---|---|---|---|---|---|---|---|
| 0 | 0 | 0 | 0 | 0 | * | 0 | * |
| 1 | 0 | 0 | 0 | 0 | * | 0 | * |
| 0 | 1 | 0 | 0 | 0 | * | 0 | * |
| 1 | 1 | 0 | 0 | 1 | * | 0 | * |
| 0 | 0 | 1 | 0 | 0 | * | 0 | * |
| 1 | 0 | 1 | 0 | 0 | * | 0 | * |
| 0 | 1 | 1 | 0 | 0 | * | 0 | * |
| 1 | 1 | 1 | 0 | 0 | * | 0 | * |
| 0 | 0 | 0 | 1 | 0 | * | 1 | * |
| 1 | 0 | 0 | 1 | 0 | * | 1 | * |
| 0 | 1 | 0 | 1 | 0 | * | 1 | * |
| 1 | 1 | 0 | 1 | 1 | * | 1 | * |
| 0 | 0 | 1 | 1 | 0 | * | 1 | * |
| 1 | 0 | 1 | 1 | 0 | * | 1 | * |
| 0 | 1 | 1 | 1 | 0 | * | 1 | * |
| 1 | 1 | 1 | 1 | 0 | * | 1 | * |

FIG. 22

RECONFIGURABLE OPERATIONAL AMPLIFIER

BACKGROUND OF THE INVENTION

Technical Field

The present invention relates to a reconfigurable op-amp.

Background Art

Reconfigurable (programmable or writable) semiconductor devices such as FPGAs (Field-Programmable Gate Arrays) offer flexibility due to their ability to be rewritten, and are thus in wide use (see Patent Document 1, for example). Furthermore, the miniaturization of reconfigurable devices such as FPGAs (field-programmable gate arrays) has been advancing in recent years.

RELATED ART DOCUMENT

Patent Document

Patent Document 1: Japanese Patent Application Publication No. 2002-538652, which is a Japanese Translation of PCT International Publication No. WO 00/51239

SUMMARY OF THE INVENTION

Unlike digital circuits such as FPGAs, analog circuits require higher operating voltages and currents from semiconductor devices, which makes the miniaturization thereof difficult. As such, it is necessary to provide an analog design, separate from a FPGA, in a semiconductor device that requires analog input/output. However, unlike digital circuit design, where design inputs can be made using hardware description language, analog circuit design is difficult tool-based design and therefore requires longer design times than digital circuit design.

Accordingly, the present invention is directed to a scheme that substantially obviates one or more of the above-discussed and other problems due to limitations and disadvantages of the related art. One aspect for solving the aforementioned problem is making it possible to reconfigure the circuit configuration, change the properties, and so on of an op-amp, as indicated by the following set of items.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides:

1. A reconfigurable op-amp, including: a first signal input terminal; a second signal input terminal; an output terminal; an operational amplifier having a non-inverting input, an inverting input, and an output; a negative feedback circuit path from the output of the operational amplifier to the inverting input of the operational amplifier; a first input circuit path from the first signal input terminal to the non-inverting input of the operational amplifier; a second input circuit path from the second signal input terminal to the inverting input of the operational amplifier; an output circuit path from the output of the operational amplifier to the output terminal; and a plurality of logic units, wherein one or more of the plurality of logic units are provided in at least one of the negative feedback circuit path, the first input circuit path, the second input circuit path, and the output circuit path.

2. The reconfigurable op-amp according to item 1, further including: a resistor in at least one path among the negative feedback circuit path, the first input circuit path, the second input circuit path, and the output circuit path; wherein in the at least one path in which the resistor is provided, the one or more of the plurality of logic units are provided so as to selectively bypass or connect the resistor.

3. The reconfigurable op-amp according to item 2, wherein the resistor is provided in a plurality in series or in parallel to each other in the at least one path.

4. The reconfigurable op-amp according to any one of items 1 to 3, wherein each of the plurality of logic units includes a plurality of address lines, a plurality of data lines, a memory unit, and an address decoder that decodes an address signal and outputs a decoded signal to the memory unit.

5. The reconfigurable op-amp according to any one of items 1 to 4, wherein each of the plurality of logic units is a multi-lookup table.

6. The reconfigurable op-amp according to any one of items 1 to 5, wherein the plurality of logic units and the operational amplifier are packaged within a same chip package.

7. A reconfigurable op-amp device, including: a plurality of the reconfigurable operational amplifiers according to any one of items 1 to 5; and logic units that connect the plurality of reconfigurable operational amplifiers to one another.

8. A reconfigurable op-amp device including: a plurality of the reconfigurable operational amplifiers according to any one of items 1 to 5; and transistors that connect the plurality of reconfigurable operational amplifiers to one another.

According to an embodiment of the present invention, the circuit configuration of an op-amp can be reconfigured, the properties thereof can be changed, and so on.

It is to be understood that both the foregoing general description and the following detailed description are exemplary and explanatory, and are intended to provide further explanation of the invention as claimed.

BRIEF DESCRIPTION OF THE DRAWINGS

FIG. 17 is a diagram illustrating a truth table of the logic circuit illustrated in FIG. 16.

FIG. 19 is a diagram illustrating a truth table of the connection element illustrated in FIG. 18.

FIG. 22 illustrates a truth table of the logic element and the connection element illustrated in FIG. 21.

DETAILED DESCRIPTION OF EMBODIMENTS

A reconfigurable op-amp will be described hereinafter, with reference to the drawings, based on the following configuration. Note that the reconfigurable op-amp is constituted of an op-amp, which is an analog circuit, and a plurality of MLUTs (Multiple Look-Up Tables). An MLUT has a memory such as an SRAM (Static Random Access Memory), with data handled as a truth table stored in each storage element thereof, and address lines being connected to data output lines of another MLUT. The MLUT functions as an LUT for operating as a logic circuit, functions as a signal switch for operating as a wiring element, and functions as a memory for holding reconfiguration information. The reconfigurable op-amp provides a reconfiguration function by rewriting the data in the truth tables of the MLUTs.

Hereinafter, 1. a reconfigurable op-amp, 2. an MRLD chip, 3. an MRLD, 4. an MLUT, 5. a synchronous/asynchronous MLUT, 6. MLUT logic operations, and 7. a method for generating truth table data will be described in that order.

1. Reconfigurable Op-Amp

Figure 1:
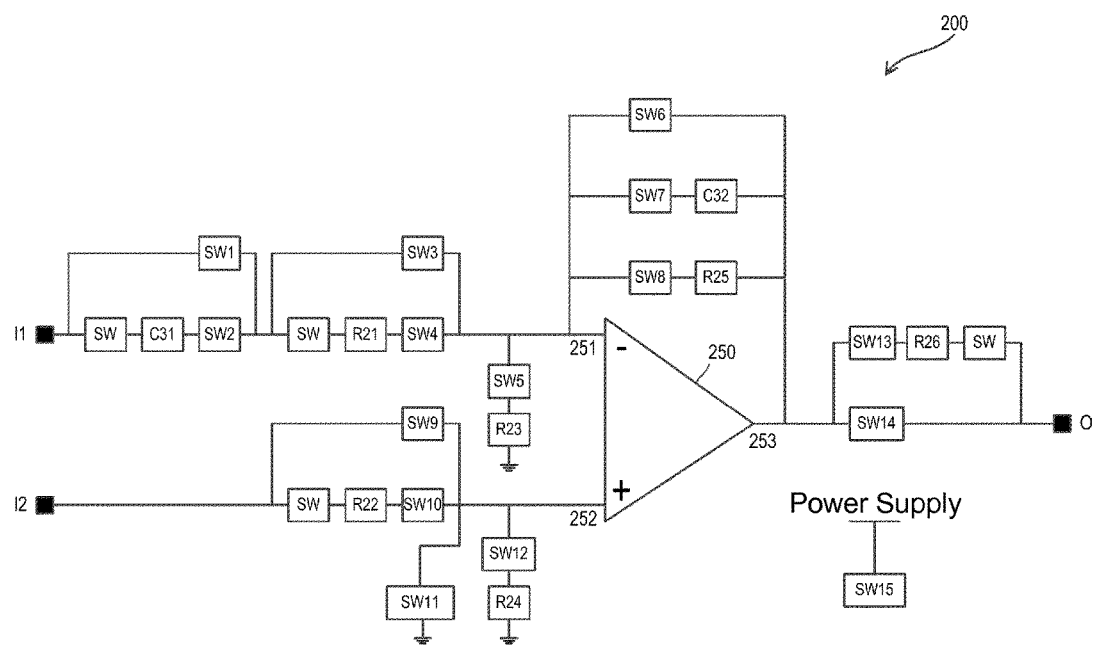
FIG. 1 is a diagram illustrating an example of a reconfigurable op-amp according to an embodiment.

FIG. 1 is a diagram illustrating an example of a reconfigurable op-amp according to the present embodiment. A reconfigurable op-amp 200 includes an op-amp (operational amplifier) 250, where SW1 to 15 indicate MLUTs operating as switches, R21 to 26 indicate resistances, and C31 and 32 indicate capacitors.

The op-amp 250 includes an inverting input terminal (−) 251, a non-inverting input terminal (+) 252, and a single output terminal 253. The terminals 251 to 253 are electrically connected to an input terminal I1, an input terminal I2, and an output terminal O, respectively. There is also a feedback circuit from the terminal 253 to the terminal 251.

In the reconfigurable op-amp 200, switches SW and resistors R are disposed in the wiring between the terminal 251 and the terminal I1, the wiring between the terminal 252 and the terminal I2, the wiring between the terminal 253 and the terminal O, and the wiring between the terminal 251 and the terminal 253, and the circuit topology and resistance can be changed by changing the wiring paths using the switches SW.

1.1. Topology Conversion in Reconfigurable Op-Amp

By turning the switches SW provided within the reconfigurable op-amp 200 ON and OFF, the circuit topology of the reconfigurable op-amp can be changed and a variety of circuit configurations can be made. In FIGS. 2A to 2F, referred to hereinafter, desired circuit configurations are realized by turning the switches SW ON and OFF in order to switch the wiring paths.

A. Inverting Amplifier Circuit

Figure 2A:
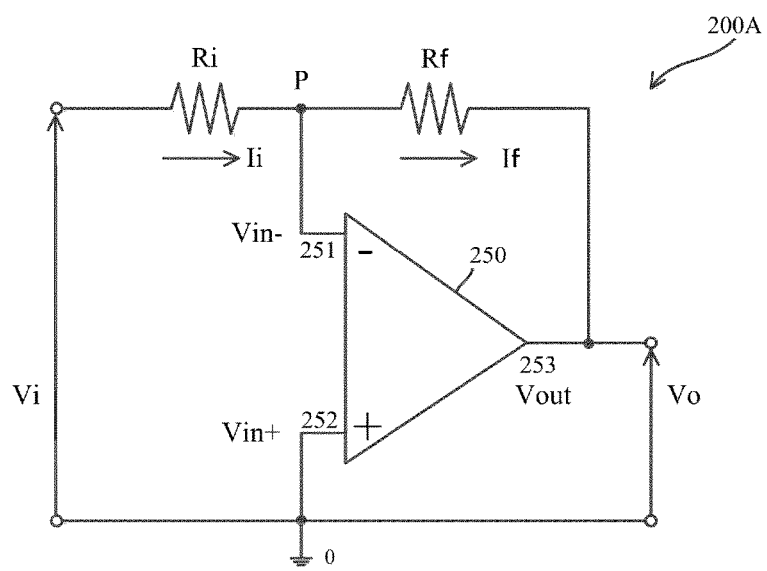
FIG. 2A illustrates an example of a reconfigurable op-amp that constitutes an inverting amplifier circuit.

FIG. 2A illustrates an example of a reconfigurable op-amp that constitutes an inverting amplifier circuit. TABLE 2A shown at the bottom of FIG. 2A illustrates the ON/OFF configuration of the switches SW1 to 15 for realizing the inverting amplifier circuit.

As illustrated in FIG. 2A, by turning the switches SW1, 4, 8, 11, 14, and 15 ON and turning the other switches SW OFF, the inverting amplifier circuit is realized by a reconfigurable op-amp 200A. In the thus configured inverting amplifier circuit, a resistance Ri is connected to the inverting input terminal (−) 251 and the input is added thereto, and the non-inverting input terminal (+) 252 is grounded. Then, using a feedback resistance Rf, negative feedback is applied to the inverting input terminal (−) 251 from the output.

B. Integrating Circuit

Figure 2B:
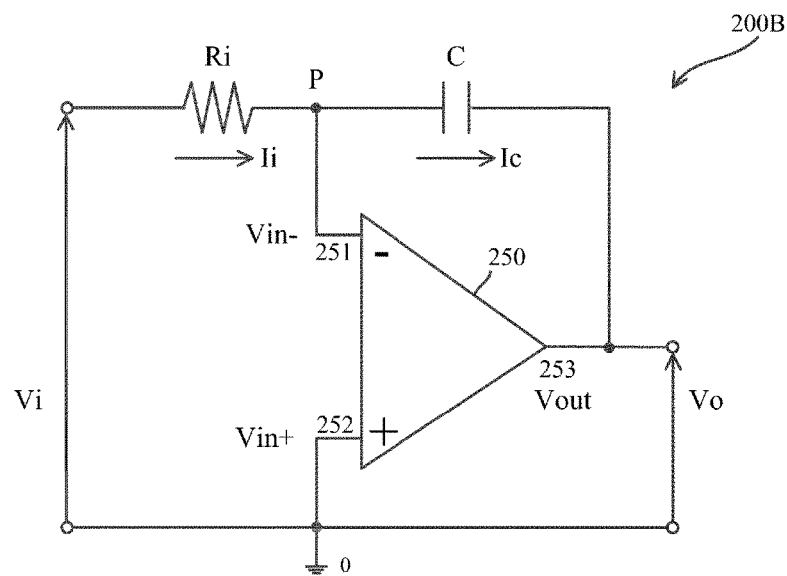
FIG. 2B illustrates an example of a reconfigurable op-amp that constitutes an integrating circuit.

FIG. 2B illustrates an example of a reconfigurable op-amp that configures an integrating circuit. TABLE 2B shown at the bottom of FIG. 2B illustrates the ON/OFF configuration of the switches SW1 to 15 for realizing the integrating circuit. As illustrated in the drawing, the op-amp integrating circuit is a circuit in which the feedback resistance of the inverting amplifier circuit has been replaced with a capacitor.

As illustrated in FIG. 2B, by turning the switches SW1, 4, 7, 11, 14, and 15 ON and turning the other switches SW OFF, the integrating circuit is realized by a reconfigurable op-amp 200B.

C. Differentiating Circuit

Figure 2C:
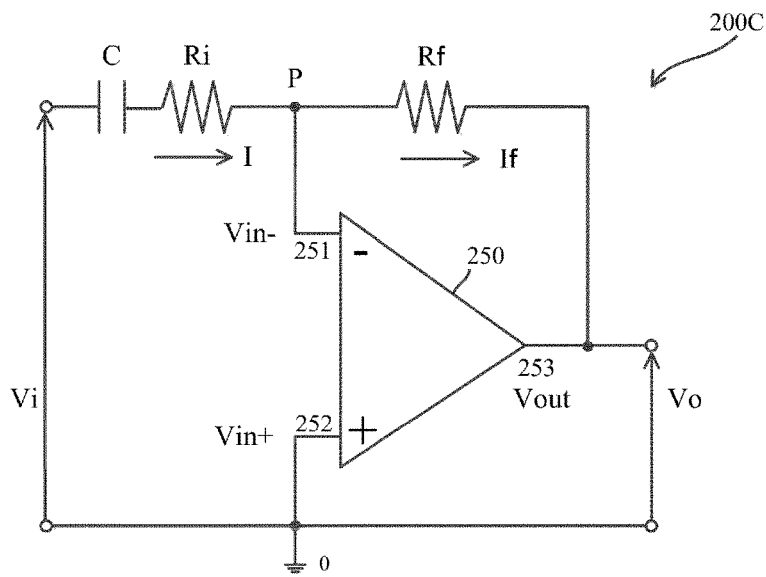
FIG. 2C illustrates an example of a reconfigurable op-amp that constitutes a differentiating circuit.

FIG. 2C illustrates an example of a reconfigurable op-amp that configures a differentiating circuit. TABLE 2C shown at the bottom of FIG. 2C illustrates the ON/OFF configuration of the switches SW1 to 15 for realizing the differentiating circuit. The op-amp differentiating circuit is a circuit in which the input resistance of the inverting amplifier circuit has been replaced with a capacitor, which is the opposite of the integrating circuit.

As illustrated in FIG. 2C, by turning the switches SW2, 4, 8, 11, 14, and 15 ON and turning the other switches SW OFF, the differentiating circuit is realized by a reconfigurable op-amp 200C.

D. Voltage Follower

Figure 2D:
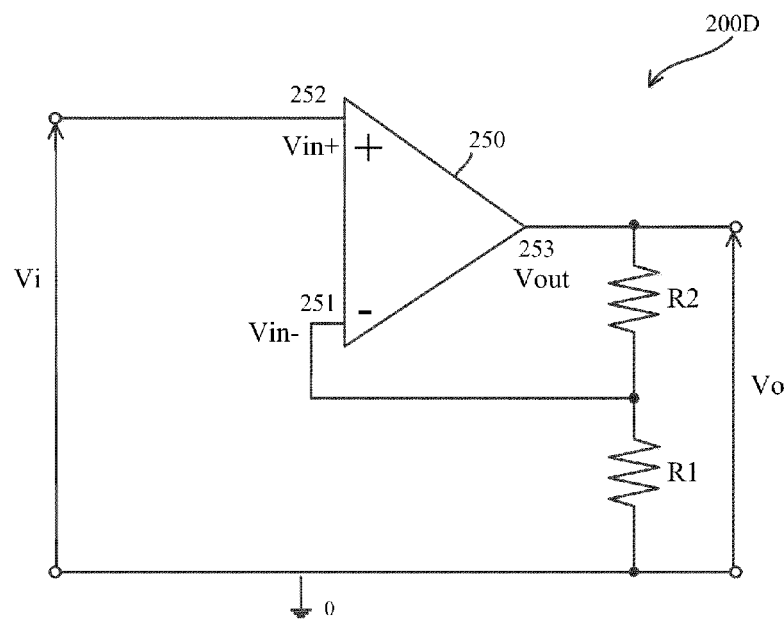
FIG. 2D illustrates an example of a reconfigurable op-amp that constitutes a voltage follower.

FIG. 2D illustrates an example of a reconfigurable op-amp that configures a voltage follower. TABLE 2D shown at the bottom of FIG. 2D illustrates the ON/OFF configuration of the switches SW1 to 15 for realizing the voltage follower. In the op-amp voltage follower, the output terminal 253 feeds back to the inverting input terminal (−) 251 at a gain of 1. The voltage of a signal inputted to the non-inverting input terminal (+) 252 is the same as the voltage at the inverting input terminal (−) 251 (called a virtual short), and thus the output voltage is the same as the input voltage.

As illustrated in FIG. 2D, by turning the switches SW6, 9, 14, and 15 ON and turning the other switches SW OFF, the voltage follower is realized by a reconfigurable op-amp 200D.

E. Differential Amplifier Circuit

Figure 2E:
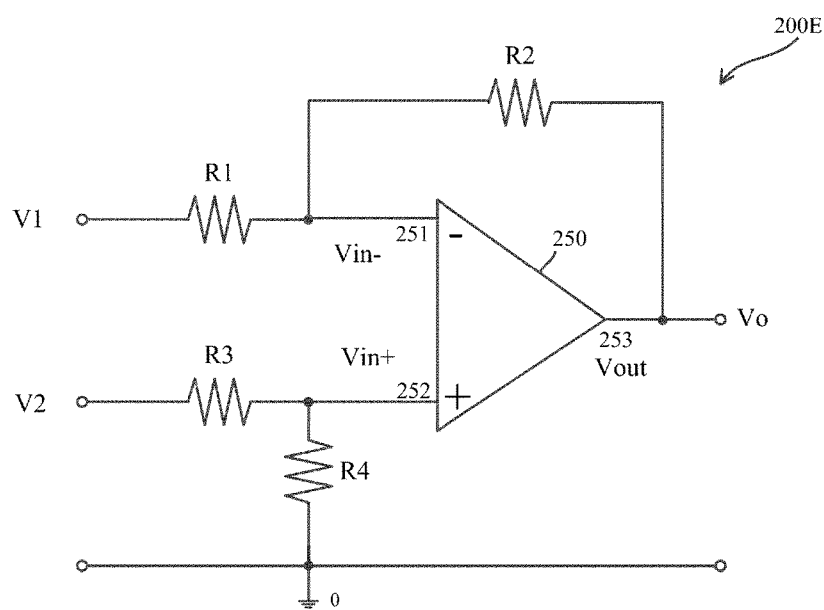
FIG. 2E illustrates an example of a reconfigurable op-amp that constitutes a differential amplifier circuit.

FIG. 2E illustrates an example of a reconfigurable op-amp that configures a differential amplifier circuit. TABLE 2E shown at the bottom of FIG. 2E illustrates the ON/OFF configuration of the switches SW1 to 15 for realizing the differential amplifier circuit. This circuit takes a difference between a voltage V1 at the terminal I1 and a voltage V2 at the terminal I2 and amplifies that difference, with an amplification rate indicated by resistance R2/R1.

As illustrated in FIG. 2E, by turning the switches SW1, 4, 8, 10, 12, 14, and 15 ON and turning the other switches SW OFF, the differential amplifier circuit is realized by a reconfigurable op-amp 200E.

F. Current/Voltage Converting Circuit

Figure 2F:
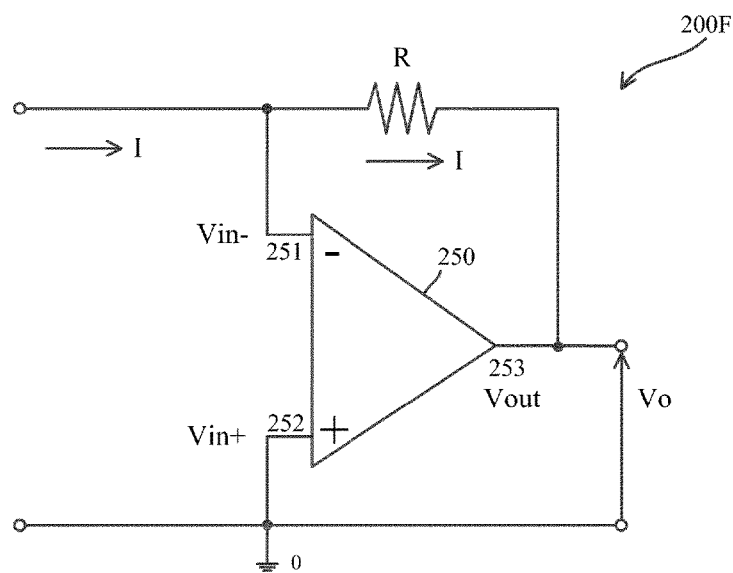
FIG. 2F illustrates an example of a reconfigurable op-amp that constitutes a current/voltage converting circuit.

FIG. 2F illustrates an example of a reconfigurable op-amp that configures a current/voltage converting circuit. TABLE 2F shown at the bottom of FIG. 2F illustrates the ON/OFF configuration of the switches SW1 to 15 for realizing the current/voltage converting circuit. The current/voltage converting circuit is a circuit that converts the magnitude of a current into a voltage and amplifies that voltage.

As illustrated in FIG. 2F, by turning the switches SW1, 3, 8, 11, 14, and 15 ON and turning the other switches SW OFF, the current/voltage converting circuit is realized by a reconfigurable op-amp 200F.

1.2 Constant Conversion in Reconfigurable Op-Amp

Figure 3:
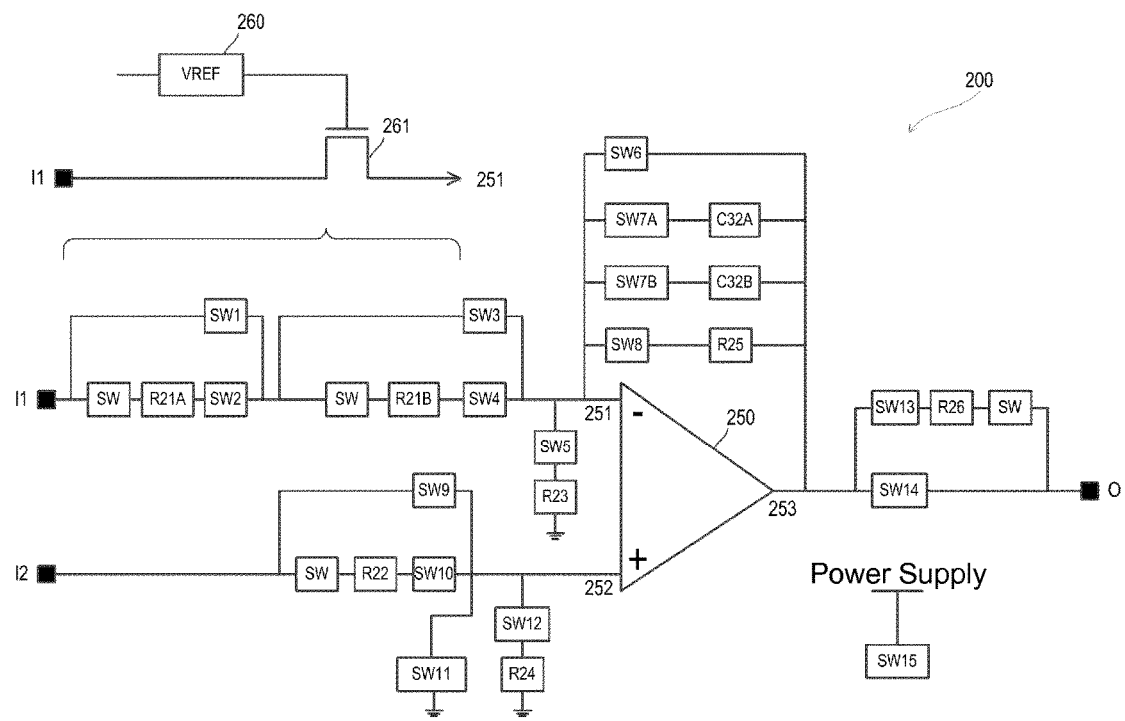
FIG. 3 is a diagram illustrating an example of constant conversion in a reconfigurable op-amp.

The reconfigurable op-amp 200 can change the resistance values of the resistors R, the capacitances of capacitors C, and so on by turning the switches SW ON and OFF. FIG. 3 is a diagram illustrating an example of constant conversion in the reconfigurable op-amp.

A. Changing Resistance Value

Resistors R21A and 21B are provided in series in the wiring between the terminal I1 and the terminal 251 in FIG. 3. At this time, in the case where the resistance in that wiring is to be increased, turning the switches SW2 and 4 ON and the switches SW1 and 3 OFF results in a configuration in which the resistors R21A and 21B are disposed in series.

A configuration is also possible in which resistances of predetermined sizes are created in advance and elements are selected therefrom. For example, in the example of FIG. 3, when the resistance of the resistor R21A is 1K ohms and the resistance of the resistor R21B is 10K ohms, and the 1K ohms of the resistor R21A is to be selected, turning the switches SW2 and 3 ON and the switches SW1 and 4 OFF results in a configuration in which the resistor R21A is selected.

Furthermore, a FET (Field effect transistor) 261 may be used as a variable resistance instead of the resistors R21A and R21B. In this case, the resistance of the FET 261 is adjusted using a property whereby the resistance value changes due to the gate voltage of the FET, by connecting, to the gate of the FET 261, a voltage selected by a VREF (Voltage REFerence) circuit. Note that the voltage can be changed by carrying out the VREF selection using an MLUT.

As described using FIG. 3, by changing the resistances, the reconfigurable op-amp 200 can change the amplification rate, change the resistance values, and change the gain, and thus the reconfigurable op-amp 200 can also be configured as a programmable gain amp (PGA).

B. Changing Capacitance of Capacitor

Capacitors 32A and 32B of a given unit are disposed in parallel in the feedback wiring from the terminal 253 to the terminal 251 in FIG. 3. The capacitor capacitance can be changed by selecting one of the capacitors using the switches SW7A and 7B.

Although the foregoing example describes the resistors R disposed in series and the capacitors C disposed in parallel, the resistors R may be disposed in parallel and the capacitors C may be disposed in series.

1.3 Circuit Configuration Using Plurality of Reconfigurable Op-Amps

Figure 4A:
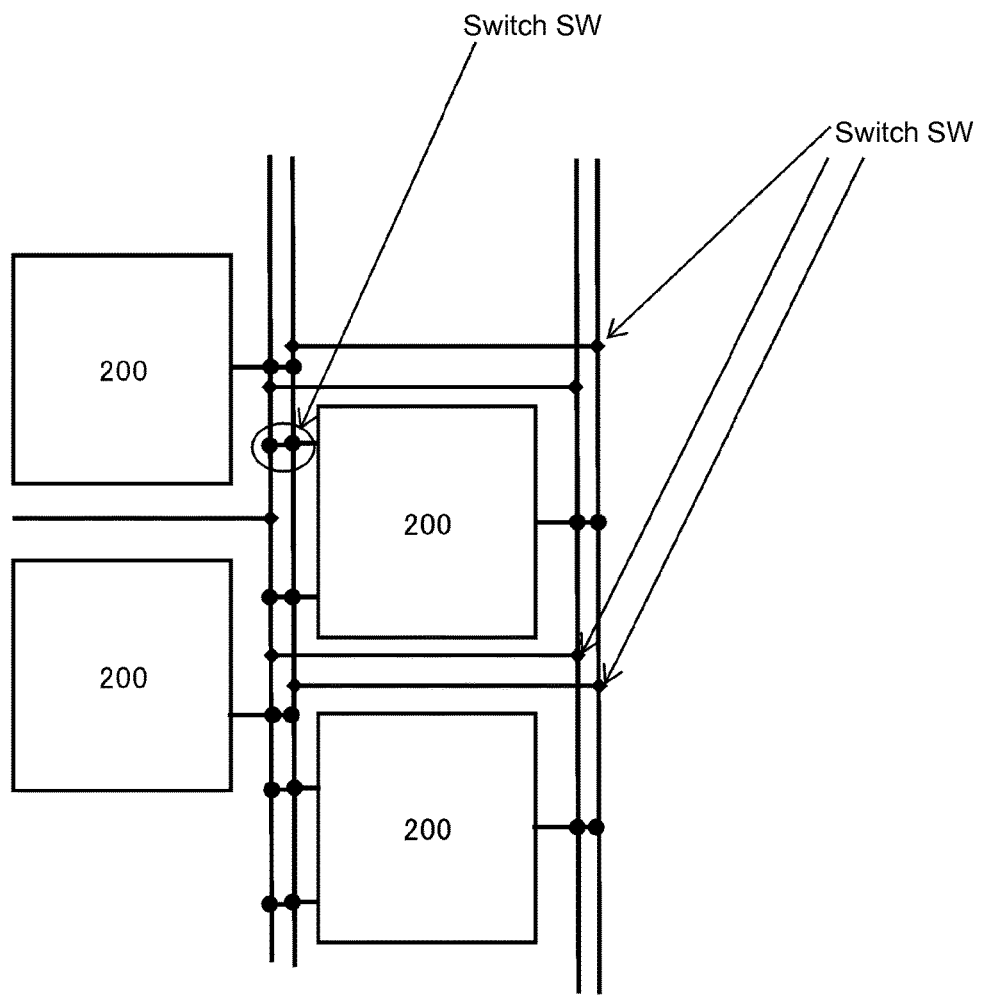
FIG. 4A is an example illustrating a circuit configuration using a plurality of reconfigurable op-amps.

FIG. 4A is an example illustrating a circuit configuration using a plurality of reconfigurable op-amps. The reconfigurable op-amps 200 serve as basic units, and are disposed in an alternating manner. Wiring regions and wiring switches SW are disposed in gaps between the reconfigurable op-amps 200. As a first working example, the switches SW may be realized as MLUTs. As a second working example, the switches SW may be constituted by PMOS (P-type Metal-Oxide-Semiconductor) and NMOS (N-type MOS) transistors, with the switching carried out by MRLD, which will be described later. In this case, two types of switch configurations are used, namely a switch constituted of an MLUT that connects the input and output terminals of the reconfigurable op-amp 200 to wiring and a dedicated MOS-type switch that switches wirings.

Figure 4B:
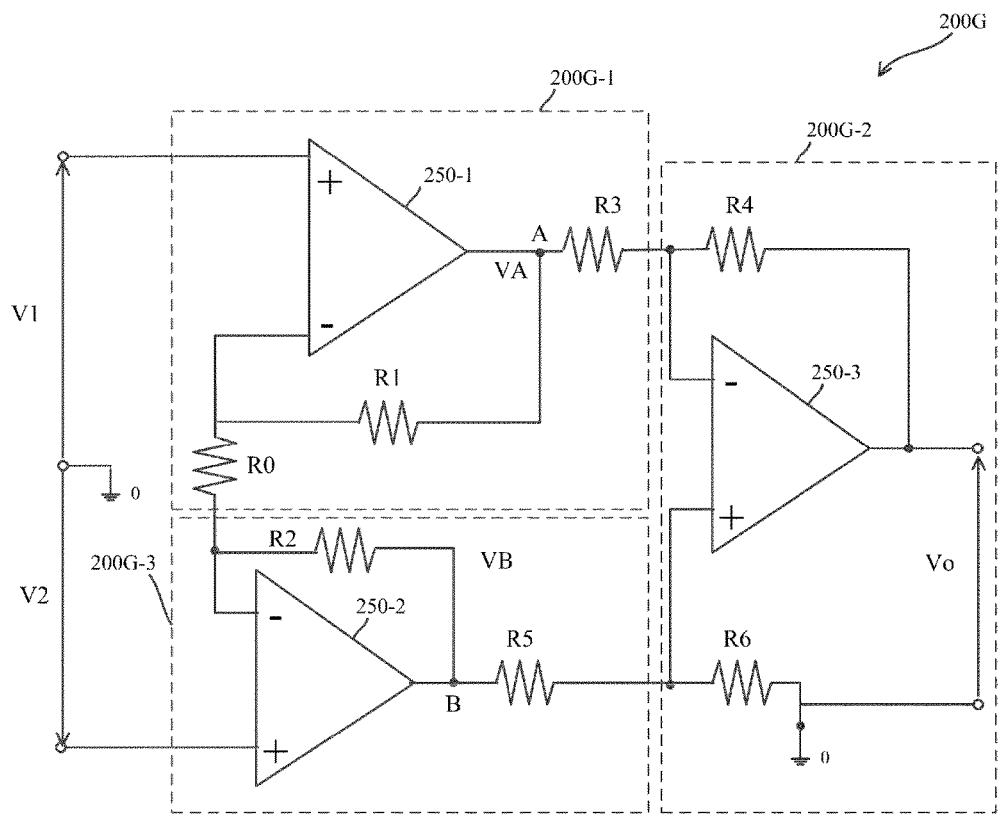
FIG. 4B is an example of a reconfigurable op-amp that constitutes an instrumentation amp, constituted of a plurality of reconfigurable op-amps.

FIG. 4B is an example of a reconfigurable op-amp 200G that configures an instrumentation amp, constituted of a plurality of reconfigurable op-amps 200G-1 to 200G-3. By combining the plurality of reconfigurable op-amps 200G-1 to 200G-3 using the switches SW as illustrated in FIG. 4A, a higher level of functionality can be provided.

2. MRLD Chip

One type of reconfigurable logic device is called an MRLD (Memory based Reconfigurable Logic Device) (registered trademark). In an MRLD, MLUTs are directly connected to each other without using wiring elements, in the same manner as in an "MPLD (Memory-based Programmable Logic Device)" (registered trademark), which realizes a circuit configuration using memory cell units; however, the MRLD is differentiated therefrom by making active use of the function of a synchronous SRAM supplied as memory IP. In the present embodiment, the reconfigurable op-amp is packaged as an MRLD chip, which will be described hereinafter.

Figure 5A:
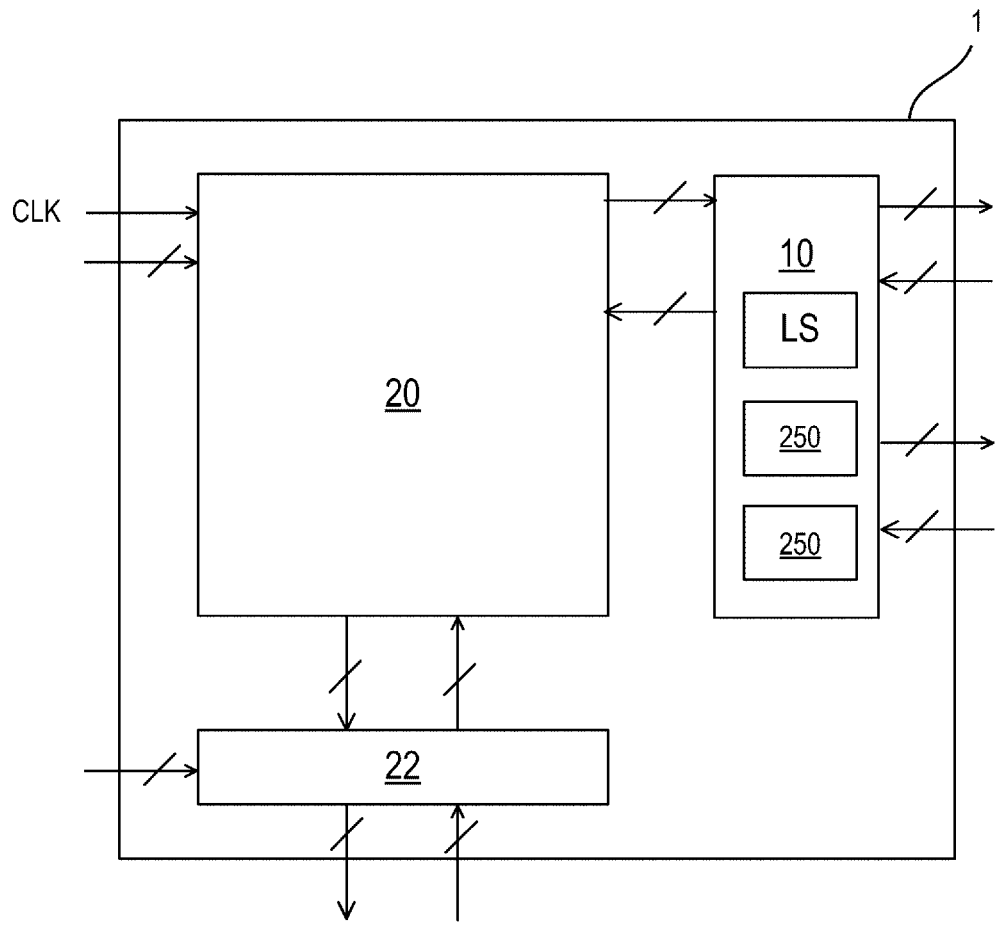
FIG. 5A is a floor plan illustrating an example of an MRLD chip according to an embodiment.

FIG. 5A is a floor plan illustrating an example of an MRLD chip according to the present embodiment. An MRLD chip 1 (called an "MRLD chip" hereinafter) illustrated in FIG. 5A includes a plurality of logic units 20 connected to each other by address lines or data lines, and an analog unit 10 having a plurality of input/output units and the aforementioned op-amps 250. Each of the logic units 20 includes a plurality of address lines, a plurality of data lines, a memory cell unit, and an address decoder that decodes an address signal and outputs the decoded signal to the memory cell unit. The plurality of logic units and the analog unit are packaged within the same chip package. Note that the logic unit 20 is an MRLD 20. An MLUT included in the MRLD 20 provides the functions of the switches SW included in the reconfigurable op-amp 200.

Figure 5B:
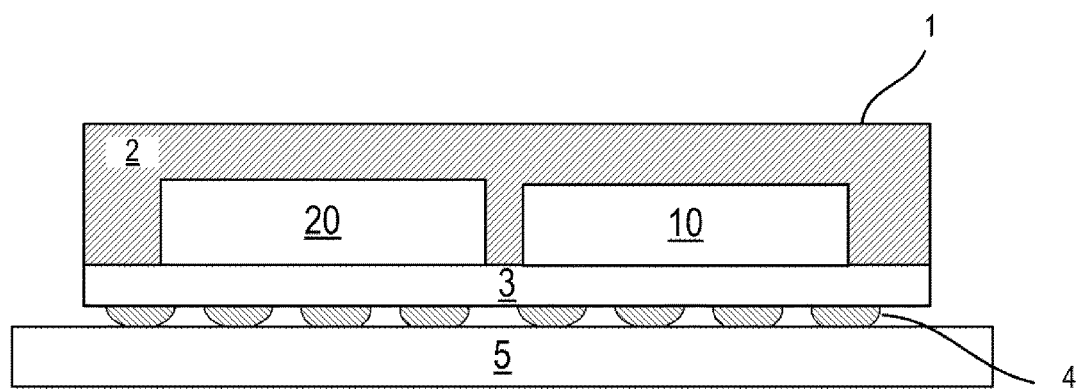
FIG. 5B is a cross-sectional view illustrating an example of an MRLD chip according to an embodiment.

FIG. 5B is a cross-sectional view illustrating an example of the MRLD chip according to the present embodiment. The MRLD 20 and the analog unit 10 are covered by a resin 2, and are placed upon an interposer substrate 3. The MRLD 20 and the analog unit 10 are electrically connected via substrate electrodes, gold wiring, or the like on the interposer substrate 3. The interposer substrate 3 is furthermore placed upon a printed circuit board 5 via external terminals 4.

The various functions of a semiconductor device are realized by an integrated circuit fabricated on a silicon chip through a complicated process. Because the silicon chip is extremely delicate, the device will cease to function due to the slightest amount of dust, moisture, or the like. Light can also be a cause of erroneous operation. The silicon chip is protected by a package in order to prevent such problems.

Although semiconductor manufacturing processes are moving toward finer fabrication, the manufacture of the MRLD chip 1 having an analog circuit according to the present embodiment is carried out through a semiconductor manufacturing process that is also capable of manufacturing an analog circuit. As such, the benefits of finer fabrication are sacrificed in order to manufacture the device as a single chip, which provides the benefits of a single-chip configuration and furthermore reduces the burden of designing the analog circuit.

Returning to FIG. 5A, the analog unit 10 includes a level shifter (LS) and the op-amps (OpAmp) 250. The level shifter is controlled by two power source voltages, which are not shown, and the input voltage can be stepped up or stepped down by adding those power source voltages thereto.

The MRLD chip 1 further includes a configuration unit 22. The configuration unit 22 has a function for reading out or writing configuration data of the MRLD 20.

Figure 6A:
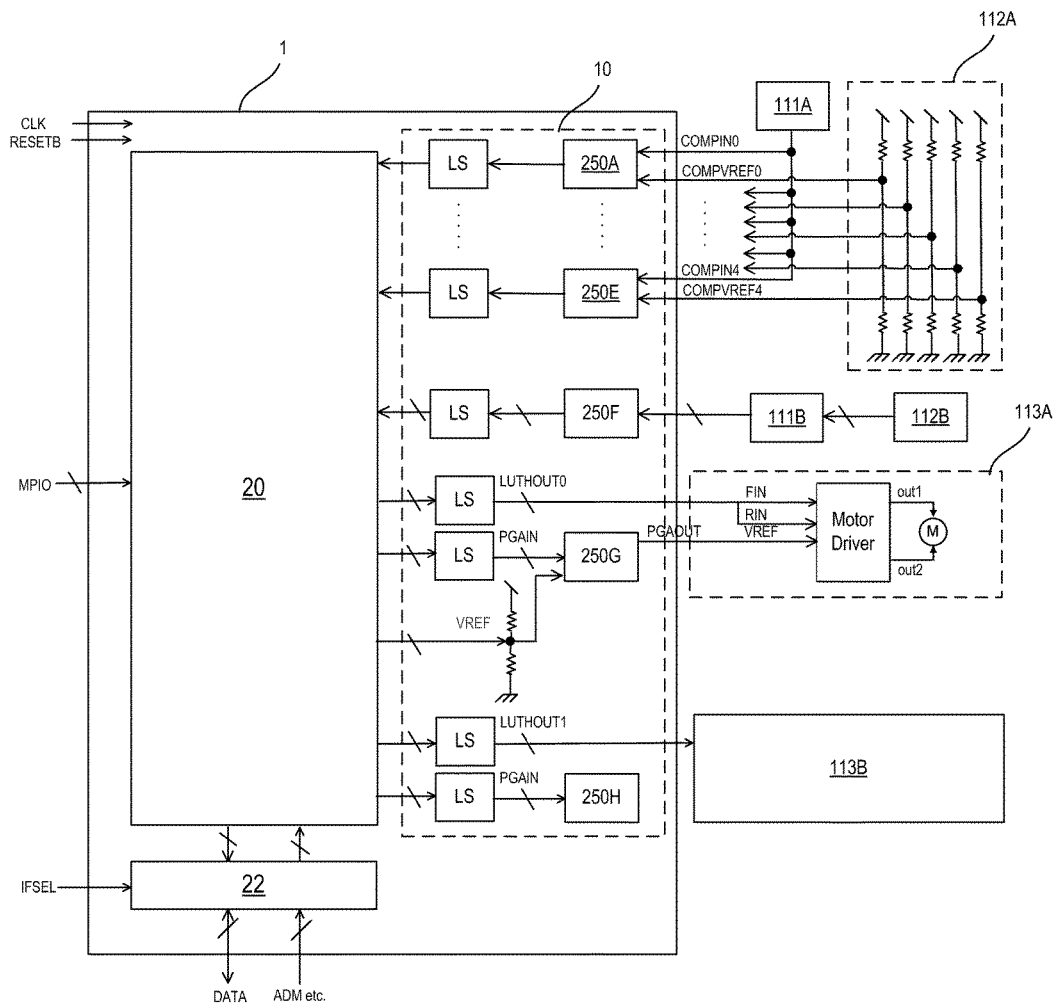
FIG. 6A is a floor plan illustrating in detail an example of an analog circuit-equipped MRLD chip according to an embodiment.

FIG. 6A is a floor plan illustrating in detail an example of the MRLD chip according to the present embodiment. Table 1, below, indicates signal names and terminal functions of the MRLD chip 1 illustrated in FIG. 6A. The MRLD 20 illustrated in FIG. 6A includes 12×12 MLUTs (described later). The analog unit 10 of the MRLD chip 1 includes a plurality of level shifters (LS) and a plurality of op-amps 250A to H. The op-amps 250A to E may be used in the case where the reconfigurable op-amp 200 is configured as a comparator, and 250G and H may be used in the case where the reconfigurable op-amp 200 is configured as a programmable gain amp (PGA). An analog power source of 5V, a logic power source of 1.8V, a GND: 0V, and a pin number of 144 pins are provided.

Each MLUT includes two 16-word×8-bit memory cell units, one for synchronous use, and one for asynchronous use. The configuration unit 22 receives configuration data from an external terminal bus and writes the configuration data individually to the MLUTs.

A range sensor 111, a comparator VREF voltage dividing circuit 112, and a motor driver 113 are provided outside of the MRLD chip 1. The MRLD chip 1 takes an input from an external device (the range sensor 111 and the comparator VREF voltage dividing circuit 112) using the analog unit 10, adjusts the signal voltage using the level shifters, and then the MRLD 20 takes the input as an address signal. The MRLD chip 1 amplifies a data output signal of the MRLD 20 using the PGA, and outputs the amplified signal to the motor driver 113.

TABLE 1

| Signal Name | Bit | Input/Output | Terminal | Description | |
|---|---|---|---|---|---|
| [system] | | | | | |
| CLK | 1 | I | PD | Logic Sync Clock/Config | 1.8 V |
| RESETB | 1 | I | PU | Hard Reset - Config Circuit | 1.8 V |
| [Mode Control] | | | | | |
| MLCTRL | 1 | I | PU | MRLD Operating | 1.8 V |
| [MRLD Configuration Control/Address/Data] | | | | | |
| OEN | 1 | I | PU | Read Enable 1 = Data Input | 1.8 V |
| WEN | 1 | I | PU | Write Enable 1 = disable | 1.8 V |
| ADC<3:0> | 4 | I | PD | Configuration Column | 1.8 V |
| ADR<3:0> | 4 | I | PD | Configuration Row Address | 1.8 V |
| ADM<5:0> | 6 | I | PD | Configuration LUT Address | 1.8 V |
| DATA<7:0> | 8 | IO | PD | Configuration Data | 1.8 V |
| MPIO_T | 13 | IO | PD | MRLD Logic Operation | 1.8 V |
| MPIO_L | 22 | IO | PD | MRLD Logic Operation | 1.8 V |
| MPIO_B | 13 | IO | PD | MRLD Logic Operation | 1.8 V |
| LUTIN | 1 | I | PD | LUT Terminal Input 1.8 V | 5 V |
| LUTOUT | 1 | O | | LUT Terminal Output 1.8 V | 5 V |
| LUTHIN<5:0> | 6 | I | PD | LUT Terminal Input 5 V | 5 V |
| LUTHOUT<5:0> | 6 | O | | LUT Terminal Output 5 V | 5 V |
| [Auto config] | | | | | |
| SCL | 1 | O | | I2C Clock | 1.8 V |
| SDA | 1 | IO | | I2C Data | 1.8 V |
| IFCLK | 1 | I | PD | I2C IF Clock | 1.8 V |
| IFSEL | 1 | I | PD | Parallel or I2C Use | 1.8 V |
| CONFDONE | 1 | O | | Config Complete Signal | 1.8 V |
| CONFSTART | 1 | I | PD | Auto Config Start | 1.8 V |

TABLE 1-continued

| Signal Name | Bit | Input/Output | Terminal | Description | |
|---|---|---|---|---|---|
| [Analog] | | | | | |
| INLS0 | 1 | I | | Level Shifter Input 1.8 V | 1.8 V |
| INLS1 | 1 | I | | Level Shifter Input 5 V Type | 5 V |
| OUTLS0 | 1 | O | | Level Shifter Output 5 V | 5 V |
| OUTLS1 | 1 | O | | Level Shifter Output 1.8 V | 1.8 V |
| COMPIN<4:0> | 5 | I | | Comparator Input | 5 V |
| COMPVREF<4:0> | 5 | I | | Comparator Reference | 5 V |
| COMPOUT<4:0> | 5 | O | | Comparator Output | 5 V |
| PGAIN | 1 | I | | Programmable Gain Amp | 5 V |
| PGAOUT | 1 | O | | Programmable Gain Amp | 5 V |
| PGREF | 1 | I | | Programmable Gain Amp | 5 V |
| PGGAIN<2:0> | 3 | I | | Programmable Gain Amp | 5 V |
| PG_EN | 1 | I | PD | Programmable Gain Amp | 5 V |
| COMP_EN | 1 | I | PD | Comparator Enable | 5 V |
| [Power] | | | | | |
| VDDL | 7 | | | Core Power Source 1.8 V | |
| VDDH | 3 | | | Analog Power Source 5 V | |
| VSSL | 7 | | | Core GND 1.8 V | |
| VSSH | 3 | | | Analog GND 5 V | |
| N.C | 2 | | | NC | |
| Total | 144 | | | | |

Figure 6B:
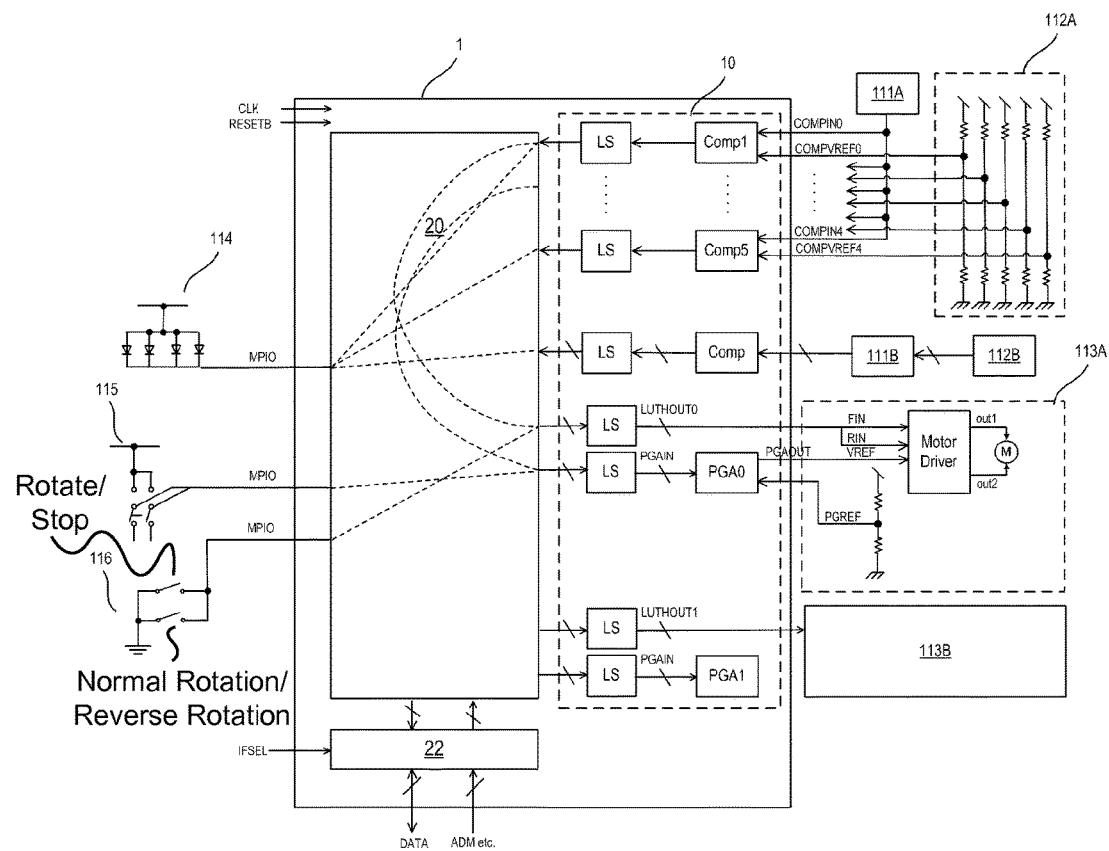
FIG. 6B is a diagram illustrating an example of operations of the MRLD chip illustrated in FIG. 6A.

FIG. 6B is a diagram illustrating an example of operations of the MRLD chip illustrated in FIG. 6A. The range sensor 111 is disposed on the exterior. Comp1 to 5 and PGA0 illustrated in FIG. 6B indicate functions realized by the reconfigurable op-amp 200. The functions of the MRLD chip 1 will be described hereinafter using this operation example.

In FIG. 6B, a status display LED 114, a motor RPM setting circuit 115, and a motor rotation control switch 116 are provided outside of the MRLD chip 1, in addition to the example illustrated in FIG. 6A.

Range Sensor Control (Indicated by Dotted Line Signal Lines)

The MRLD can monitor the output of the range sensor using a comparator (Comp) configured by the op-amp 250. The comparator is an element that compares the magnitudes of two voltages and outputs different values depending on a result of the comparison. The comparator has two input terminals, and when analog voltages are applied to those input terminals, the value of an output switches depending on which of the inputted voltage is greater. A plurality of circuits may be combined within the analog unit 10, such as providing a level shifter at the exit of the comparator, providing a level shifter at the entrance to the amp, and so on. Furthermore, voltages are inputted into the VREFs of each comparator from the comparator VREF voltage dividing circuit 112, which is outside of the MRLD chip 1. The output of the range sensor 111 is connected to the inputs of all of the comparators. The range sensor 111 outputs a voltage. That voltage is then compared to each VREF, and the comparators then output H or L. Each of the resulting signals traverses a 5V-to-1.8V level shifter and is inputted into the MRLD 20. The MRLD 20 outputs those signals to MPIO_x (where x indicates the terminal used), causing the LED 114 to emit light.

Motor Driver Control (Indicated by Dotted Line Signal Lines)

OR logic is generated in the MRLD 20 for the outputs of the comparators inputted into the MRLD 20, and the motor driver 113 is controlled ON and OFF. The motor driver 113 carries out PWM control based on the value of VREF. The VREF to the motor driver is set by the PGA configured by the op-amp 250. A 3-bit signal is inputted from the MPIO_x, traverses a 1.8V-to-5V level shifter from the MRLD 20, and sets the gain of the PGA. The gain can be set to 1×, 2×, 5×, and 10×.

A fixed voltage is inputted for the PGA input (PGAIN), and the motor speed can be changed by making that gain setting so as to vary a voltage of PGAOUT. Turning motor rotation ON and OFF and controlling forward/reverse rotation is also realized by taking an input from the MPIO_x, defining a logic in the MRLD with the output of the comparator, traversing a 1.8V-to-5V level shifter, and inputting into a control terminal (FIN/RIN) of the motor driver.

Through this, the output of the motor driver 113 can be controlled using the input of the range sensor 111, for example. In addition, as with the example indicated by the dotted lines in FIG. 6B, reconfiguring the MRLD 20 makes it possible to switch operational control from a range sensor 111A to a motor driver 113A, from the range sensor 111A to a motor driver 113B, from a range sensor 111B to the motor driver 113A, or from the range sensor 111B to the motor driver 113B. Furthermore, synchronized operations can also be carried out, namely from the range sensor 111A to the motor driver 113A and from the range sensor 111B to the motor driver 113B, and from the range sensor 111A to the motor driver 113B and from the range sensor 111B to the motor driver 113A.

In this manner, a reconfiguration function of the analog unit 10 can be provided simply by changing the configuration data of the MRLD 20.

3. MRLD

Figure 7:
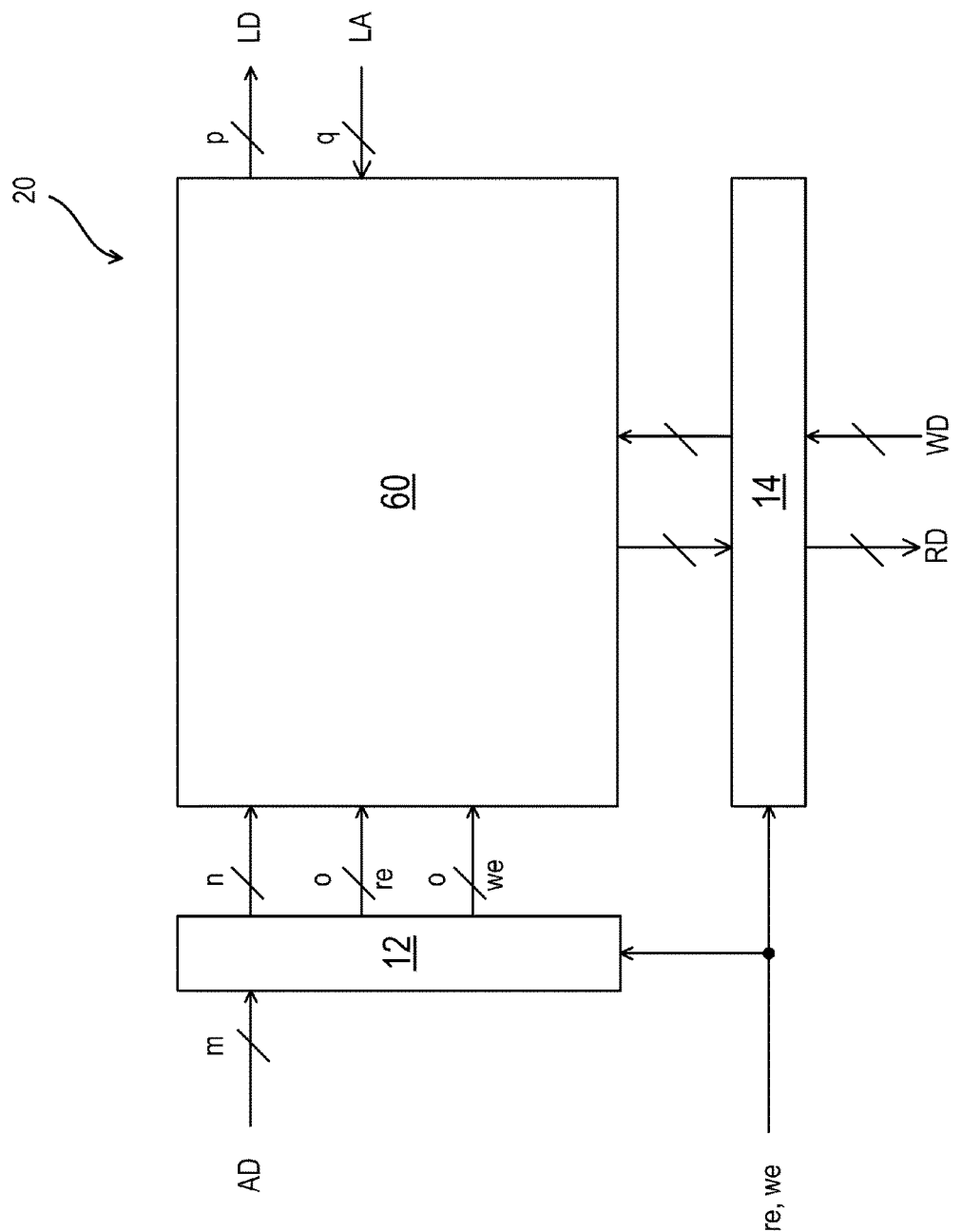
FIG. 7 is a diagram illustrating a first example of the overall configuration of a semiconductor device according to an embodiment.

FIG. 7 is a diagram illustrating an example of the overall configuration of a semiconductor device according to the present embodiment. Reference character 20 indicated in FIG. 7 is an example of an MRLD. The MRLD 20 includes a plurality of MLUTs 30 that use synchronous SRAM, an MLUT array 60 disposed in array form, and a row decoder 12 and column decoder 14 that specify memory readout operations and write operations of the MLUTs 30.

The MLUTs 30 are constituted by synchronous SRAM. By storing data handled as truth tables in the respective storage elements of the memories, the MLUTs 30 carry out logic operations for operating as a logic element, a connection element, or as a logic element and a connection element.

A logic address LA and logic data LD, indicated by solid lines, are used in the logic operations of the MRLD 20. The logic address LA is used as an input signal of the logic circuit. The logic data LD is used as an output signal of the logic circuit. The logic address LA of the MLUT 30 is connected to the data line for the logic data LD of the adjacent MLUT.

The logic realized by the logic operations of the MRLD 20 is realized by the truth table data stored in the MLUTs 30. Several MLUTs 30 operate as logic elements, as combinatorial circuits including an AND circuit, an adder, and so on. Other MLUTs 30 operate as connection elements interconnecting the MLUTs 30 that realize the combinatorial circuits. Rewriting of the truth table data for realizing the logic elements and the connection elements by the MLUTs 30 is carried out by write operations into the memories.

Write operations of the MRLD 20 are carried out through a write address AD and write data WD, and readout operations are carried out through a write address AD and readout data RD.

The write address AD is an address specifying memory cells within the MLUT 30. The write address AD specifies n memory cells, with n being 2 to the mth power, for m signal lines. The row decoder 12 accepts MLUT addresses via the m signal lines, decodes the MLUT addresses, and selects and specifies the MLUTs 30 that are to undergo the memory operations. The memory operation addresses are used in a memory readout operation, a memory write operation, and in both operations are decoded by the row decoder 12 and the column decoder 14 via the m signal lines, and select the target memory cells. Although this will be described later, in the present embodiment, the decoding of a logic operation address LA is carried out by a decoder within the MLUT.

The row decoder 12 decodes x bits of the m bits of the write address AD in accordance with control signals such as a read enable signal re, a write enable signal we, and so on, and outputs the decoded addresses n to the MLUT 30. The decoded addresses n are used as addresses for specifying memory cells within the MLUT 30.

The column decoder 14 decodes y bits of the m bits of the write address AD, and has a function similar to that of the row decoder 12, outputting the decoded addresses n to the MLUT 30 as well as inputting the write data WD and outputting the readout data RD.

Note that in the case where the MLUT array has s rows and t columns, n×t bits of data are inputted into the decoder 12 from the MLUT array 60. Here, the row decoder outputs o rows' worth of re and we in order to select the MLUTs row by row. In other words, o rows correspond to s rows in the MLUT. Here, by setting 1 bit of the 0 bits to be active, the word line of a specific memory cell is selected. Because t MLUTs output n bits of data, n×t bit data is selected from the MLUT array 60 and is used by the column decoder 14 to select one column thereof.

4. MLUT

Figure 8:
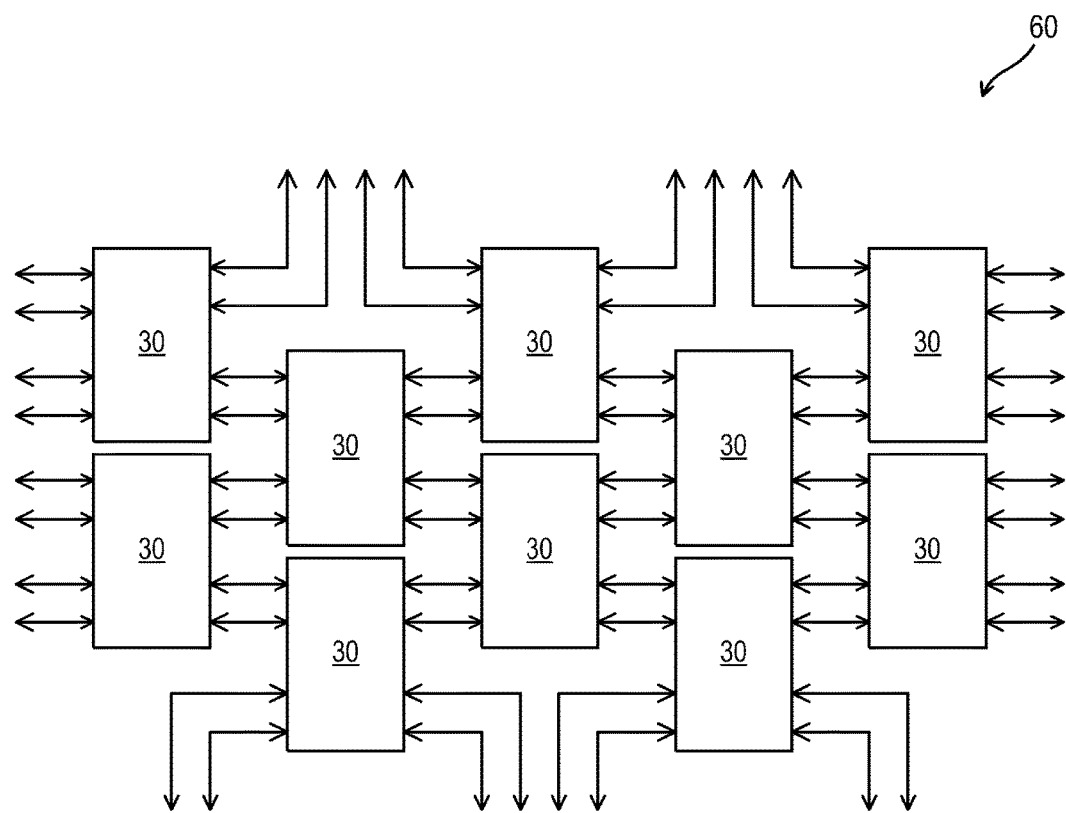
FIG. 8 is a diagram schematically illustrating MLUTs configured by horizontally stacking MLUTs constituted of two memory cell units.

FIG. 8 is a diagram schematically illustrating MLUTs configured by horizontally stacking MLUTs constituted of two memory cell units. Each MLUT 30 illustrated in FIG. 8 has inputs of addresses A0L to A7L, indicated in FIG. 9, from the left direction, and inputs of addresses A0R to A7R, indicated in FIG. 9, from the right direction, and furthermore has outputs of data D0L to D7L, indicated in FIG. 9, to the left direction, and outputs of data D0R to D7R, indicated in FIG. 9, to the right direction. An MLUT whose n value=8 becomes 1 Mbit in conventional techniques, resulting in an increase in scale, with the CLB equivalent to 4 Mbit. However, as will be described later, in the present technique, the configuration is 8K (256 words×16 bits×two MLUTs).

Figure 10:
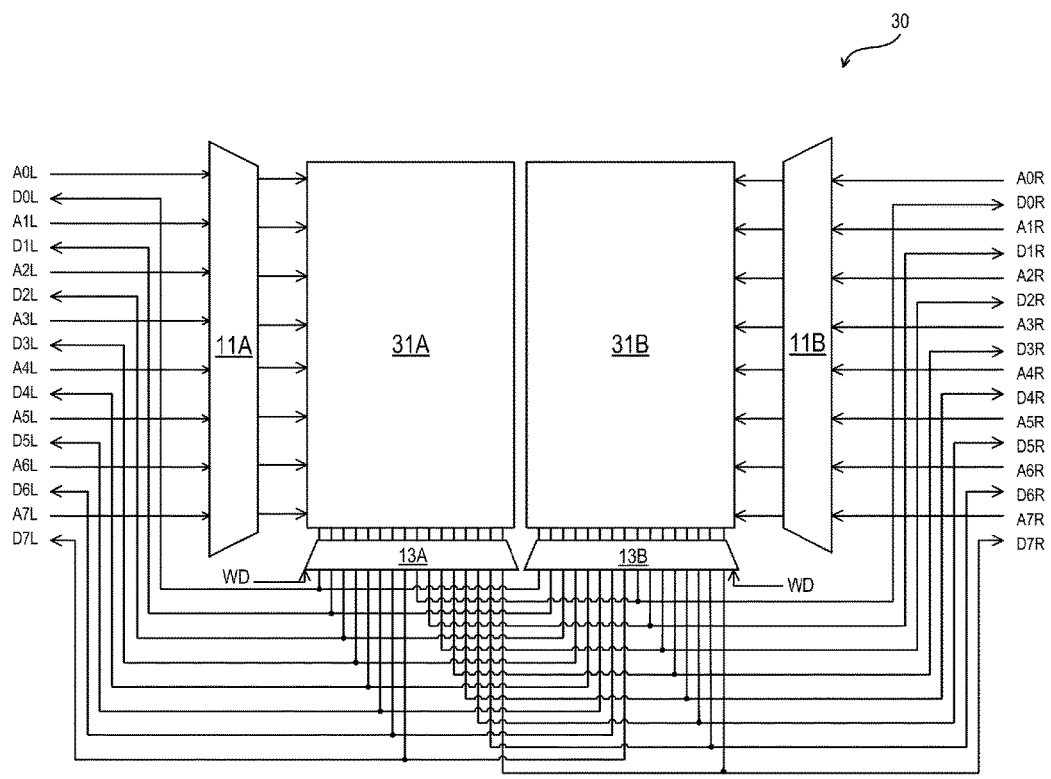
FIG. 10 is a diagram illustrating a circuit example of the MLUT illustrated in FIG. 9.

FIG. 10 is a diagram illustrating an example of an MLUT using a high-capacity memory.

Figure 9:
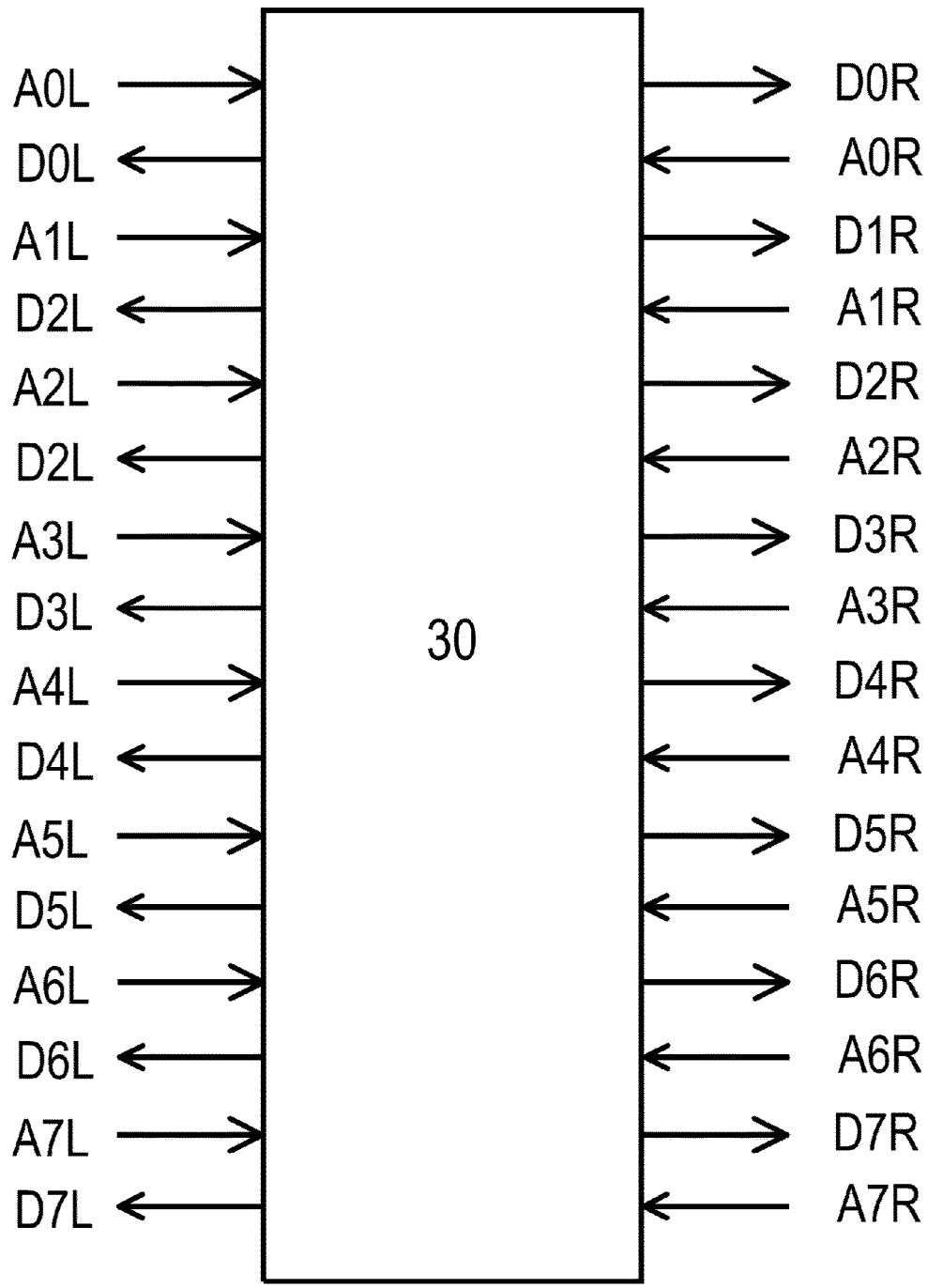
FIG. 9 is a diagram illustrating an example of an MLUT using a high-capacity memory.

FIG. 10 is a diagram illustrating a circuit example of the MLUT illustrated in FIG. 9. The MLUT 30 illustrated in FIG. 10 has memory cell units 31A and 31B. Each memory cell unit is an SRAM, for example. As illustrated in FIG. 10, the memory cell unit 31A has a plurality of memory cells specified from one side by a first plurality of address lines and outputting to a first plurality of data lines that are twice the number of the first plurality of address lines, the memory cell unit 31B has a plurality of memory cells specified from another side by a second plurality of address lines and outputting to a second plurality of data lines that are twice the number of the second plurality of address lines; the MLUT 30 outputs some of the first plurality of data lines and second plurality of data lines to the one side and outputs the remaining first plurality of data lines and second plurality of data lines to the other side.

Each memory cell unit stores truth table data in memory cells on a direction-by-direction basis. As such, truth table data for the right to left direction and truth table data for the left to right direction are stored in each of the memory cell units 31A and 31B. In other words, the MLUT stores two instances of truth table data, each of which defines a specific data output direction.

By having more data lines than address lines in each memory cell unit and setting the direction of the data output from each memory cell unit to be bidirectional, the necessary number of memory cells can be reduced and bidirectional data output can be achieved.

Figure 11:
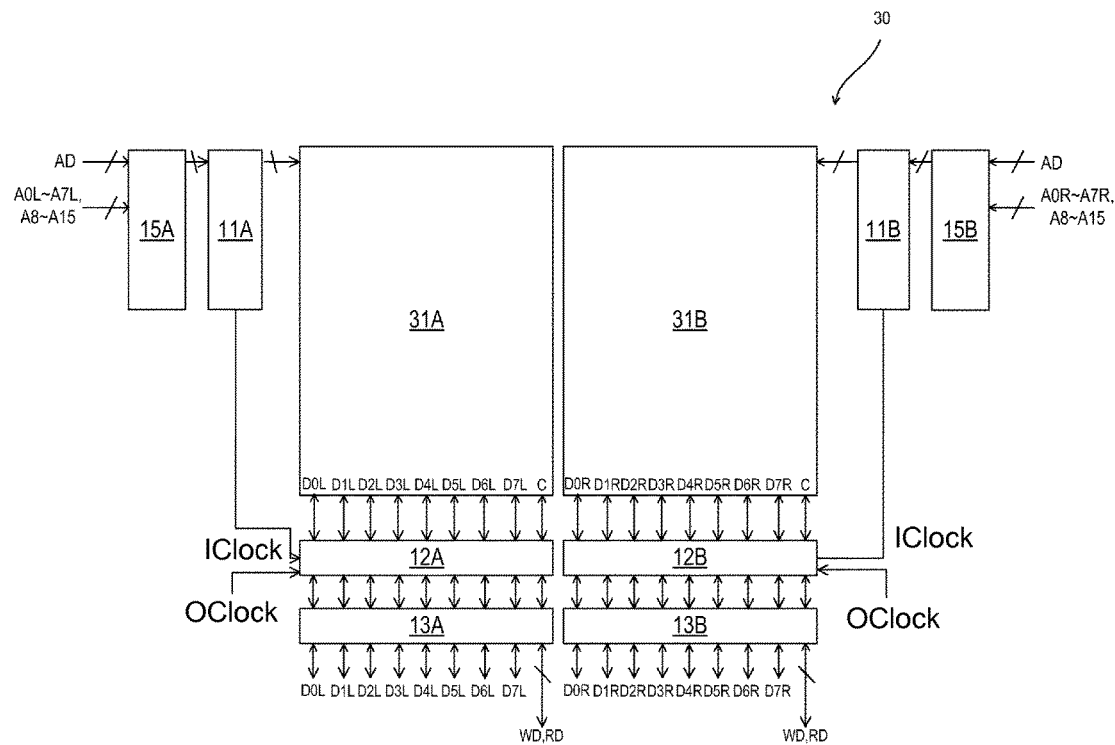
FIG. 11 is a diagram illustrating an MRLD using the MLUT illustrated in FIG. 9.

FIG. 11 is a diagram illustrating a circuit example in more detail than the MLUT illustrated in FIG. 10. The MLUT 30 illustrated in FIG. 11 includes the memory cell units 31A and 31B, address decoders 11A and 11B, address selectors 15A and 15B, I/O (input/output) buffers 12A and 12B, and data selectors 13A and 13B. Each of the memory cell units 31A and 31B has an address decoder, an address selector, an I/O buffer, and a data selector. Input addresses to the memory cell units 31A and 31B are the addresses A0L to A7L and A8 to A15, and the addresses A0R to A7R and A8 to A15, respectively. As such, the memory cell units 31A and 31B have a high capacity of 512K, or 2 to the 16th power (65,536) words×8 bits.

In FIG. 11, the memory cell units 31A and 31B have inputs of the addresses A0L to A7L and A8 to A15, and the addresses A0R to A7R and A8 to A15, respectively.

Note that FIG. 10 is a schematic diagram and thus does not illustrate the decoders and so on, which are peripheral circuitry of the memory cell units; the decoders, which are the decoders 11A and 11B illustrated in FIG. 11, are prepared for each memory cell unit, and are disposed between the address selectors 15A and 15B and the memory cell units 31A and 31B. As such, the decoders may decode all of the addresses outputted from the address selectors 15A and 15B.

The address selectors 15A and 15B are selection circuits for switching to a logic operation address line or a write address. These are necessary for single-port memory cells. The address selectors are unnecessary for dual-port memory cells. The data selectors 13A and 13B are selection circuits that switch the output data or the write data.

An MRLD can use a conventional high-capacity memory device without undergoing semiconductor design trials and manufacture for a dedicated small-size SRAM. Memory IP (Intellectual Property) is used when implementing the MRLD as a chip, but the area of an address decoder, a sense amplifier, and so on is large with respect to the small memory capacities required by conventional MLUTs, resulting in the memory itself having a component percentage of 50% or less. This also acts as MRLD overhead and is inefficient. The percentage occupied by the address decoder, sense amplifier, and so on drops in high-capacity memories, which makes the memory usage more efficient. As such, the present technique for high-capacity memories is useful in the case of an MRLD chip.

5. Synchronous/Asynchronous MLUT

The MLUT according to the present embodiment includes a memory cell unit for synchronous operation and a memory cell unit for asynchronous operation. The memory cell unit for synchronous operation or the memory cell unit for asynchronous operation form a pair, but a memory cell unit that operates as a logic element and/or a connection element is either one or the other. The data outputs of both are connected through a wired OR connection or an OR circuit, and thus data of "0" is stored in all non-operational memory cell units.

Figure 12:
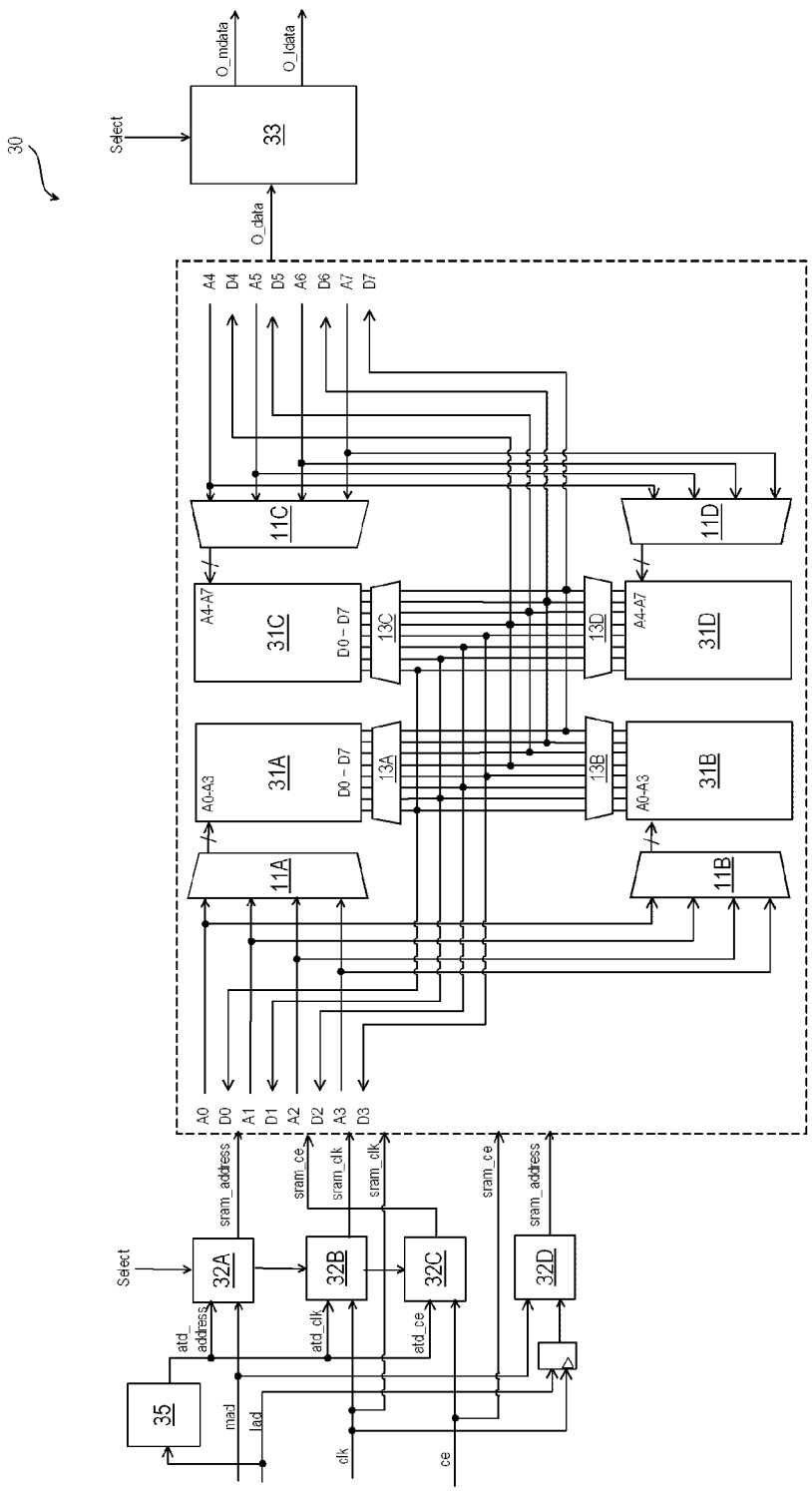
FIG. 12 is a diagram illustrating a circuit example of an MLUT capable of synchronous/asynchronous switching.

FIG. 12 is a diagram illustrating a circuit example of an MLUT capable of synchronous/asynchronous switching. The MLUT 30 illustrated in FIG. 12 includes memory cell units 31A to 31D, address decoders 11A to 11D, I/O (input/output) buffers 13A to 13D, selection circuits 32A to 32D, a data selection circuit 33, and an address transition detecting unit 35. The address transition detecting unit 35 includes an ATD (Address Transition Detector) circuit, and detects an address transition by comparing a logic address sent along with a clock and comparing that logic address with a previously-sent logic address. The address transition detecting unit 35 is the same as that illustrated in FIG. 13.

5.1 Address Transition Detecting Unit

Figure 13:
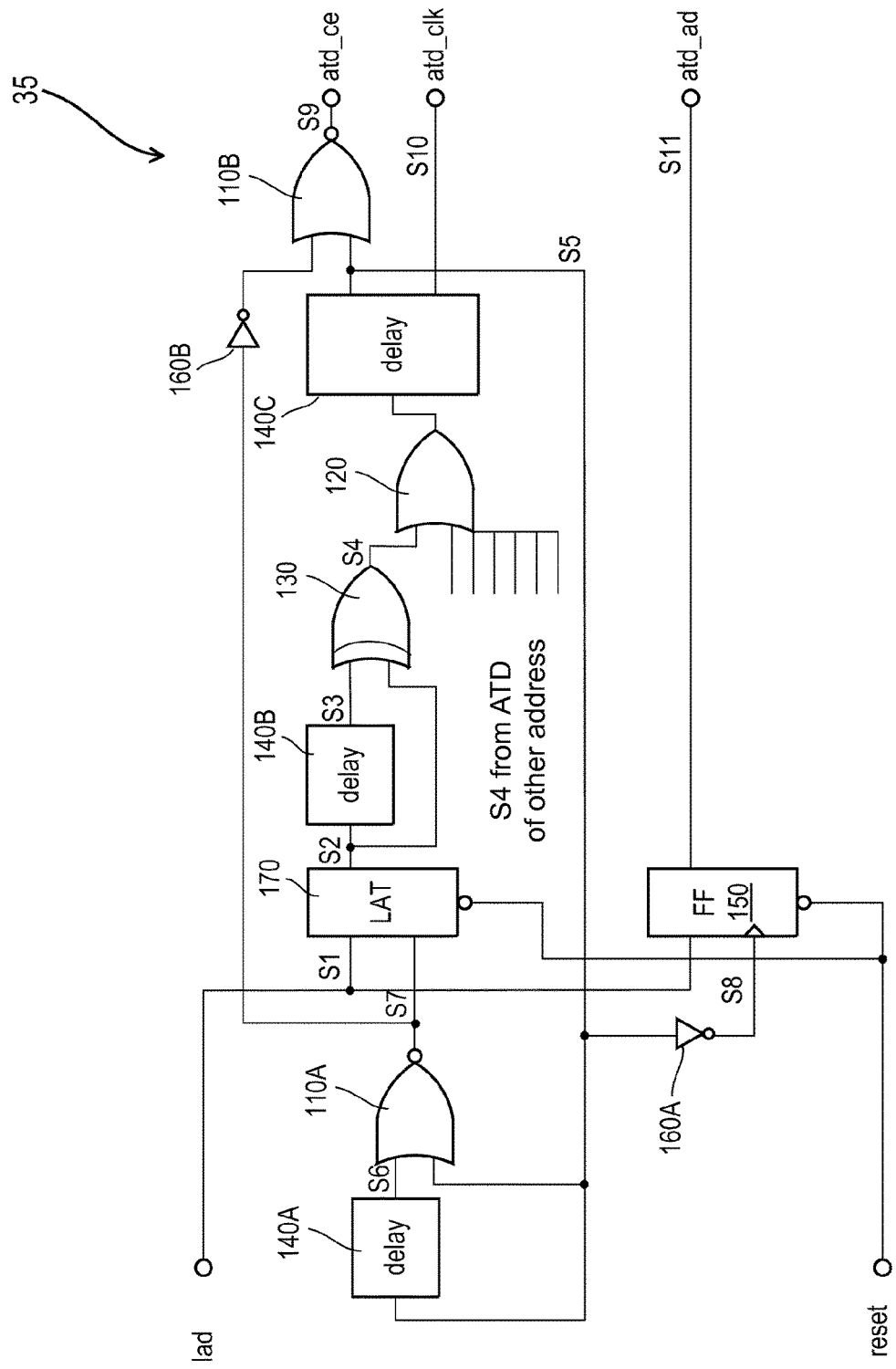
FIG. 13 is a circuit diagram illustrating an address transition detecting unit according to an embodiment.

FIG. 13 is a circuit diagram illustrating the address transition detecting unit according to the present embodiment. The address transition detecting unit 35 illustrated in FIG. 13 includes negative OR (NOR) circuit 110A and 110B, an OR circuit 120, an exclusive OR (EOR) circuit 130, delay circuits 140A to 140C, a flip-flop (FF) 150, an inverter 160B, and a D latch 170.

Figure 14:
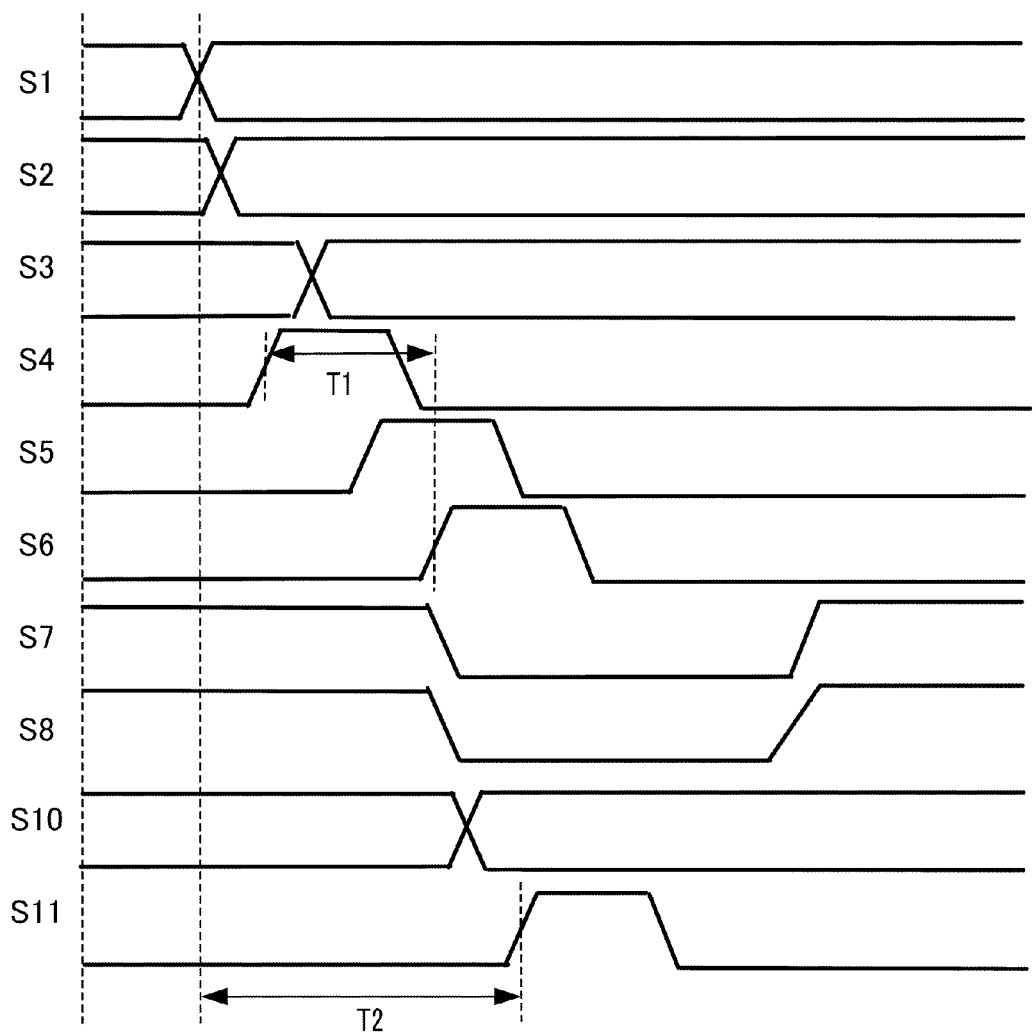
FIG. 14 is a timing chart for signals in the address transition detection illustrated in FIG. 13.

FIG. 14 is a timing chart for signals in the address transition detection illustrated in FIG. 13. Circuit operations involved in the address transition detection will be described hereinafter using descriptions of FIGS. 13 and 14.

A signal S1 is an address input signal outputted from a processor. A signal S2 is an output of the D latch. In the case where the signal S1 has changed, the D latch 170 latches the signal so it does not change for a set period. This is to ignore subsequent address transitions due to noise or the like.

A signal S3 is a delay signal outputted from the D latch 170. As illustrated in FIG. 14, the delay signal produces a clock with its rise and fall, and is delayed by the delay circuit 140B in order to generate the clock width of a signal S4.

The signal S4 generated as a clock signal detects a change and is outputted from the EOR 130. The input to and output from the delay circuit 140B are inputted into the EOR 130, and thus when the signal levels of the two differ, a signal level of "high" is outputted. An address transition can be detected as a result. A time T1 of S4 indicated in FIG. 14 indicates a time from a logic address change being detected to a FF fetch, and a time T2 indicates a time from a logic address change being detected to readout from a memory cell unit.

The signal S4 is inputted, along with other address transition signals, into the OR circuit 120, and an OR operation value is outputted. The output of the OR circuit 120 is delayed by the delay circuit 140C, and a signal S5 is outputted.

The signal S5 is a delay signal outputted from the delay circuit 140C, inputting a clock after waiting for an enable signal from the D latch 170.

The signal S6 is a signal extension of the signal S5, and generates an enable signal pulse. The NOR circuit 110A outputs a signal S7, which is a NOR operation value of the signals S5 and S6. The signal S7 then serves as the enable signal of the D latch 170. A signal S8 is a signal obtained by inverting the signal S5 in the inverter 160A, and is used in the FF 150 as a clock for latching the address signal. The signal S9 is used as an enable for the memory cell units 31A and 31C in the later stages, the signal S10 is used as a clock (atd_clk) for the memory cell units 31A and 31C, and a signal S11 is used as addresses of the memory cell units 31A and 31C. The signal S10 in FIG. 14 indicates a time from a logic address change being detected to a read from the memory.

In this manner, in the case where a processor core 210 data request has been made, a clock is generated after waiting for an address change resulting therefrom, and the memory is driven; accordingly, the memory operates when necessary and is not driven when not necessary, enabling autonomous power conservation.

5.2 Signal Lines

The signal lines illustrated in FIG. 12 are described in the following Table 2.

TABLE 2

| Signal Name | Bit Length | IO | Description |
| --- | --- | --- | --- |
| Mad | <5:0> | I | Memory Address |
| Lad | | I | Logic Address |
| Clk | | I | Clock |
| Ce | | I | SRAM Chip Enable |
| We | | I | SRAM Write Enable |
| i_data | <7:0> | I | SRAM Write Data |
| Odata | <7:0> | O | SRAM Data Output (x4) |
| o_mdata | <7:0> | O | SRAM Data Output |
| o_ldata | <7:0> | O | Logic Data Output |
| atd_ck | — | — | ATD Generation Clock |
| atd_ce | — | — | ATD Generation Chip Select |
| atd_address | — | — | ATD lad Latch Address |
| sram_ck(sync) | — | — | Real SRAM Clock (Synchronous) |
| sram_ck(async) | — | — | Real SRAM Clock (Asynchronous) |
| sram_ce(sync) | — | — | SRAM Chip Select (Synchronous) |
| sram_ce(async) | — | — | SRAM Chip Select (Asynchronous) |
| sram_address(sync) | <3:0> | — | SRAM Address Input (Synchronous) |
| sram_address(async) | <3:0> | — | SRAM Address Input (Asynchronous) |
| SELECT | — | — | Select Signal |

5.3 Synchronous/Asynchronous Memory Cell Unit

The memory cell units 31A to 31D are synchronous SRAMs. Each of the memory cell units 31A to 31D stores truth table data for connections in the left direction and in the right direction. The memory cell units 31B and 31D operate in synchronization with a system clock. On the other hand, the memory cell units 31A and 31C operate in synchronization with an ATD generated clock (also called an "internal clock signal") generated by the address transition circuit 35, described later, and thus operate asynchronously relative to the clock (the system clock). The ATD generated clock operates at a higher frequency than the system clock signal, and thus the memory cell units 31A and 31C provide an asynchronous function by appearing to operate asynchronously from outside of the MLUTs 30.

Aside from the requirements for synchronous function, the memory cell units 31A and 31C have the same functions as the memory cell units 31A and 31B illustrated in FIGS. 10 and 11. The same applies to the memory cell units 31B and 31D.

The address decoders 11A and 11B both decode the addresses A0 to A3 inputted from the left side, and output decoded signals to the memory cell units 31A and 31B, respectively, setting the word lines of the memory cell units 31A and 31B to active.

The address decoders 11C and 11D both decode the addresses A4 to A7 inputted from the right side, and output decoded signals to the memory cell units 31C and 31D, respectively, setting the word lines of the memory cell units 31C and 31D to active.

The address decoders 11A and 11C decode an SRAM address asynchronizing signal (sram_address(async)), the address decoders 11B and 11D decode an SRAM address synchronizing signal (sram_address(sync)), and the word lines of the memory cell units specified by the decoded signals are activated.

In the example illustrated in FIG. 12, each memory cell unit is a 16 word×8 bit memory block. The memory cell units 31A and 31B are capable of using 16 word×8 bit×2 in a synchronous mode and 16 word×8 bit×2 in an asynchronous mode. Synchronous and asynchronous operation is not possible simultaneously, and thus in the case where, for example, logic data has been written to a synchronously-operating memory cell unit, it is necessary to write all 0s into an asynchronously-operating memory cell unit.

Note that the data output of a memory cell unit may use a wired OR, as indicated in the drawings, or an OR logic circuit may be provided.

5.4 Selection Circuit

Selection conditions for the selection circuits are indicated in the following tables.

TABLE 3

*mlctrl = 0/1: Logic Mode/Config Mode

| sram_ck | |
|---|---|
| Mlctrl | |
| | sram_ck(async) |
| 0 | atd_clk |
| 1 | clk |
| | sram_ck(sync) |
| — | clk |

| sram_ce | | |
|---|---|---|
| Reset | mlctrl | |
| | | sram_ce(async) |
| 1 | 0 | atd_ce |
| 1 | 1 | ce |
| 0 | 1 | 0 |
| Aside from the above | | 1 |
| | | sram_ce(sync) |
| 1 | 0 | 0 |
| 1 | 1 | ce |
| 0 | 1 | 0 |
| Aside from the above | | 1 |

TABLE 3-continued

*mlctrl = 0/1: Logic Mode/Config Mode

| sram_address | | |
|---|---|---|
| Reset | mlctrl | |
| | | sram_ce(async) |
| 1 | 0 | atd_address |
| 1 | 1 | mad |
| Aside from the above | | 0 |
| | | sram_ce(sync) |
| 1 | 0 | 0 |
| 1 | 1 | ce |
| Aside from the above | | 0 |

The selection circuits 32A to 32D are circuits that select the operations of the memory cell units 31A and 31C for asynchronous operation or the memory cell units 31B and 31D for synchronous operation.

Upon asynchronous operation being selected by a selection signal (Select), the selection circuit 32A selects an atd_ad latch address (S11 indicated in FIG. 13) generated by the address transition circuit 35, and outputs this as an SRAM address asynchronizing signal (sram_address (async)). The logic address is outputted as-is in the case where asynchronous operation is not selected.

Upon asynchronous operation being selected by the selection signal (Select), the selection circuit 32B selects and outputs the ATD generated clock generated by the address transition circuit 35. The clock is outputted as-is in the case where asynchronous operation is not selected.

Upon asynchronous operation being selected by the selection signal (Select), the selection circuit 32C selects and outputs an ATD generated chip select generated by the address transition circuit 35. An SRAM chip enable is outputted as-is in the case where asynchronous operation is not selected.

Upon synchronous operation being selected by the selection signal (Select), the selection circuit 32D outputs the logic address as-is.

There is also a prohibited logic configuration as a property of memory division. The necessity of prohibited logic will be described using the two truth tables illustrated in Table 4.

TABLE 4

| Truth Table 1 | | | |
|---|---|---|---|
| Case | A0 | A1 | D0 |
| A | 0 | 0 | 0 |
| B | 0 | 1 | 0 |
| C | 1 | 0 | 0 |
| D | 1 | 1 | 1 |

| Truth Table 2 | | | |
|---|---|---|---|
| Case | A0 | A4 | D0 |
| A | 0 | 0 | 0 |
| B | 0 | 1 | 0 |
| C | 1 | 0 | 0 |
| D | 1 | 1 | 1 |

In truth table 1, an AND circuit is configured using A0 and A1, and a truth table outputted to D0 is indicated. In truth table 2, an AND circuit is configured using A0 and A4, and a truth table outputted to D0 is indicated. With the logic in the case of truth table 1, logic operations are possible with the memory cell unit 31A that uses A3-A0 alone, and thus if "0" is written into the other memory cell units, an OR operation will not affect the output values of the other memory cell units, and thus no problems arise with respect to prohibited logic.

However, in the case of the logic in truth table 2, the memory cell unit that uses A3-A0 cannot distinguish between c and d. An SRAM using A7-A4 cannot distinguish between b and d. In this manner, a logic operation spanning two memory cell units cannot obtain the correct value with two truth tables, and thus logic operations spanning two memory cell units are set as prohibited logic. Accordingly, it is necessary for the logic to be realized within each memory cell unit in the case of a logic configuration. Accordingly, the truth table data according to the present embodiment is generated so as not to produce the aforementioned prohibited logic.

5.5 I/O Buffers

The I/O (input/output) buffers 13A to 13D are synchronized with the clock or the ATD generated clock, and provide FF functionality by reading out data from the data lines of the memory cell units. Note that the I/O (input/output) buffers 13A to 13D include sense amplifiers that amplify voltages outputted from bit lines of the memory cells.

The selection circuit 33 outputs an SRAM data output (O_data) as an SRAM data output or a logic data output in accordance with a selection signal.

6. MLUT Logic Operations

A. Logic Element

Figure 15:
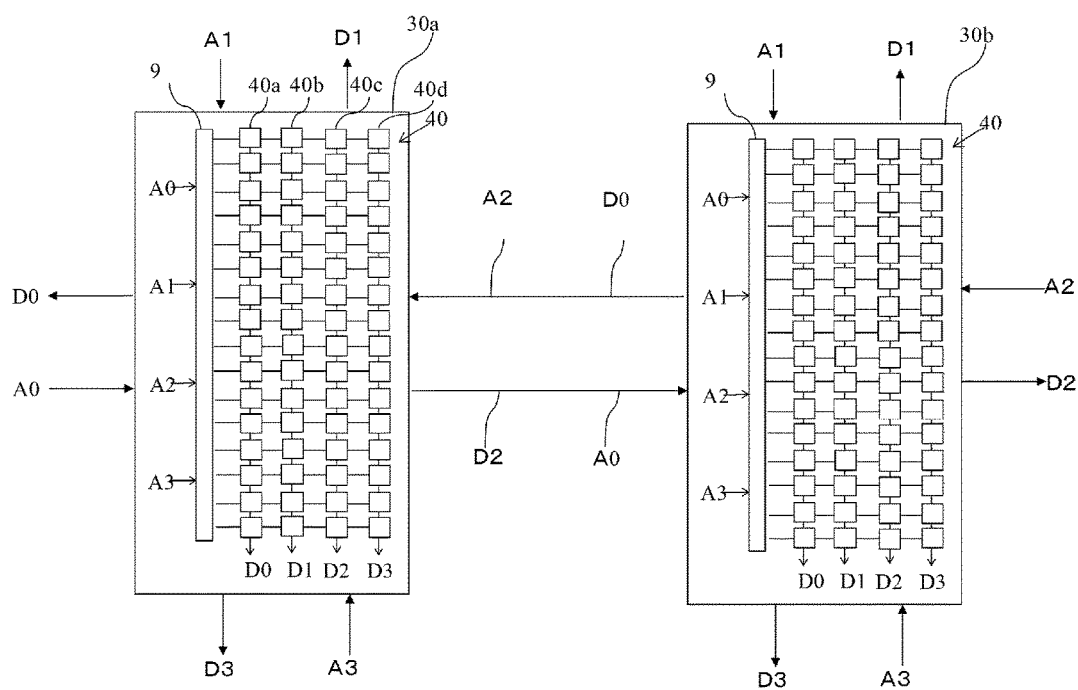
FIG. 15 is a diagram illustrating an example of an MLUT.

FIG. 15 is a diagram illustrating an example of an MLUT. The address selectors 11, input/output buffers 12, and data selectors 13 are not illustrated in FIG. 15 in order to simplify the descriptions. Each of MLUTs 30A and 30B illustrated in FIG. 15 has four logic address input LA lines A0 to A3, four logic operation data lines D0 to D3, 4×16=64 storage elements 40, and an address decoder 9. Each of the logic operation data lines D0 to D3 is connected in series to 16 of the storage elements 40. The address decoder 9 is configured to select four of the storage elements connected to one of 16 word lines based on signals inputted to the logic address input LA lines A0 to A3. The four storage elements are connected to the logic operation data lines D0 to D3, respectively, and data stored in the storage elements is outputted to the logic operation data lines D0 to D3. For example, the address decoder 9 is configured to select four storage elements 40A, 40B, 40C, and 40D in the case where given signals are inputted to the logic address input LA lines A0 to A3. Here, the storage element 40A is connected to the logic operation data line D0, the storage element 40B is connected to the logic operation data line D1, the storage element 40C is connected to the logic operation data line D2, and the storage element 40D is connected to the logic operation data line D3. The signals stored in the storage elements 40A to 40D are outputted to the logic operation data lines D0 to D3. In this manner, the MLUTs 30A and 30B accept the logic address inputs LA from the logic address input LA lines A0 to A3, and output the values stored in four of the storage elements 40 selected by the address decoder 9 due to the logic address inputs LA to the logic operation data lines D0 to D3, respectively, as logic operation data. Note that the logic address input LA line A2 of the MLUT 30A is connected to the logic operation data line D0 of the adjacent MLUT 30B, and the MLUT 30A takes the logic operation data outputted from the MLUT 30B as the logic address input LA. Meanwhile, the logic operation data line D2 of the MLUT 30A is connected to the logic address input LA line A0 of the MLUT 30B, and the logic operation data outputted by the MLUT 30A is taken by the MLUT 30B as the logic address input LA. For example, the logic operation data line D2 of the MLUT 30A outputs a signal stored in one of the 16 storage elements connected to the logic operation data line D2 to the logic address input LA line A0 of the MLUT 30B based on signals inputted to the logic address input LA lines A0 to A3 of the MLUT 30A. Likewise, the logic operation data line D0 of the MLUT 30B outputs a signal stored in one of the 16 storage elements connected to the logic operation data line D0 to the logic address input LA line A2 of the MLUT 30A based on signals inputted to the logic address input LA lines A0 to A3 of the MLUT 30B. In this manner, a connection between MLUTs uses an address line-data line pair. Hereinafter, an address line-data line pair used to connect MLUTs, such as the logic address input LA line A2 and the logic operation data line D2 of the MLUT 30A, will be called an "AD pair".

Although the MLUTs 30A and 30B have four AD pairs in FIG. 15, the number of AD pairs is not particularly limited to four, as will be described later.

Figure 16:
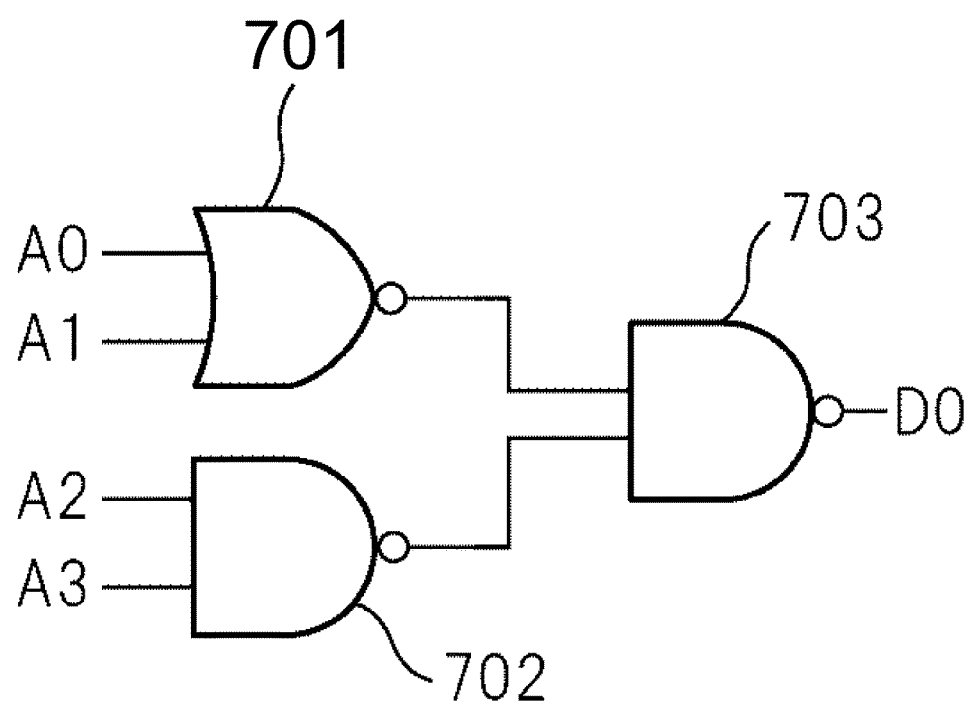
FIG. 16 is a diagram illustrating an example of an MLUT that operates as a logic circuit.

FIG. 16 is a diagram illustrating an example of an MLUT that operates as a logic circuit. In this example, the logic address input LA lines A0 and A1 serve as inputs of a dual-input NOR circuit 701, and the logic address input LA lines A2 and A3 serve as inputs of a dual-input NAND circuit 702. An output of the dual-input NOR circuit 701 and an output of the dual-input NAND circuit 702 are inputted into a dual-input NAND circuit 703, and an output of the dual-input NAND circuit 703 is outputted to the logic operation data line D0, thus configuring the logic circuit.

FIG. 17 is a diagram illustrating a truth table of the logic circuit illustrated in FIG. 16. The logic circuit in FIG. 16 has four inputs, and thus all of the inputs A0 to A3 are used as inputs. On the other hand, there is only one output, and thus only the output D0 is used as an output. Asterisks are present in the fields of the truth table for the outputs D1 to D3. This indicates that the value may be either 0 or 1. However, it is necessary to write a value of either 0 or 1 into these fields when actually writing the truth table data to the MLUT for reconfiguration.

B. Connection Element

Figure 18:
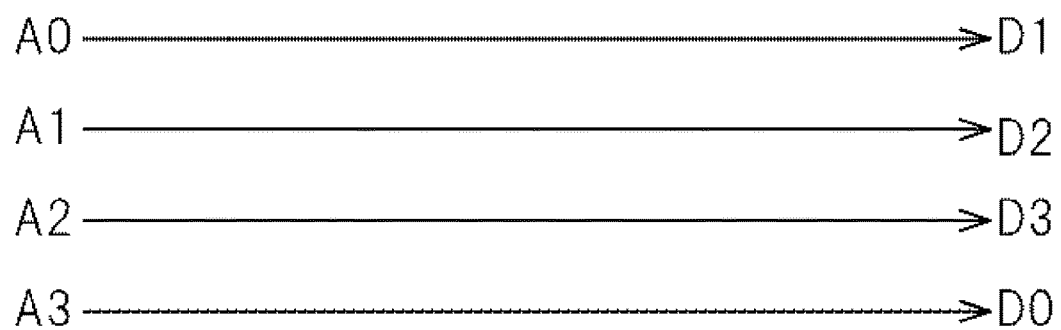
FIG. 18 is a diagram illustrating an example of an MLUT that operates as a connection element.

FIG. 18 is a diagram illustrating an example of an MLUT that operates as a connection element. In FIG. 18, the MLUT operating as a connection element operates so as to output the signal of the logic address input LA line A0 to the logic operation data line D1, output the signal of the logic address input LA line A1 to the logic operation data line D2, and output the signal of the logic address input LA line A2 to the logic operation data line D3. Furthermore, the MLUT operating as a connection element operates so as to output the signal of the logic address input LA line A3 to the logic operation data line D0.

FIG. 19 is a diagram illustrating a truth table of the connection element illustrated in FIG. 18. The connection element illustrated in FIG. 18 has four inputs and four outputs. Accordingly, all of the inputs A0 to A3 and all of the outputs D0 to D3 are used. According to the truth table illustrated in FIG. 19, the MLUT operates as a connection element that outputs the signal of the input A0 to the output D1, outputs the signal of the input A1 to the output D2, outputs the signal of the input A2 to the output D3, and outputs the signal of the input A3 to the output D0.

Figure 20:
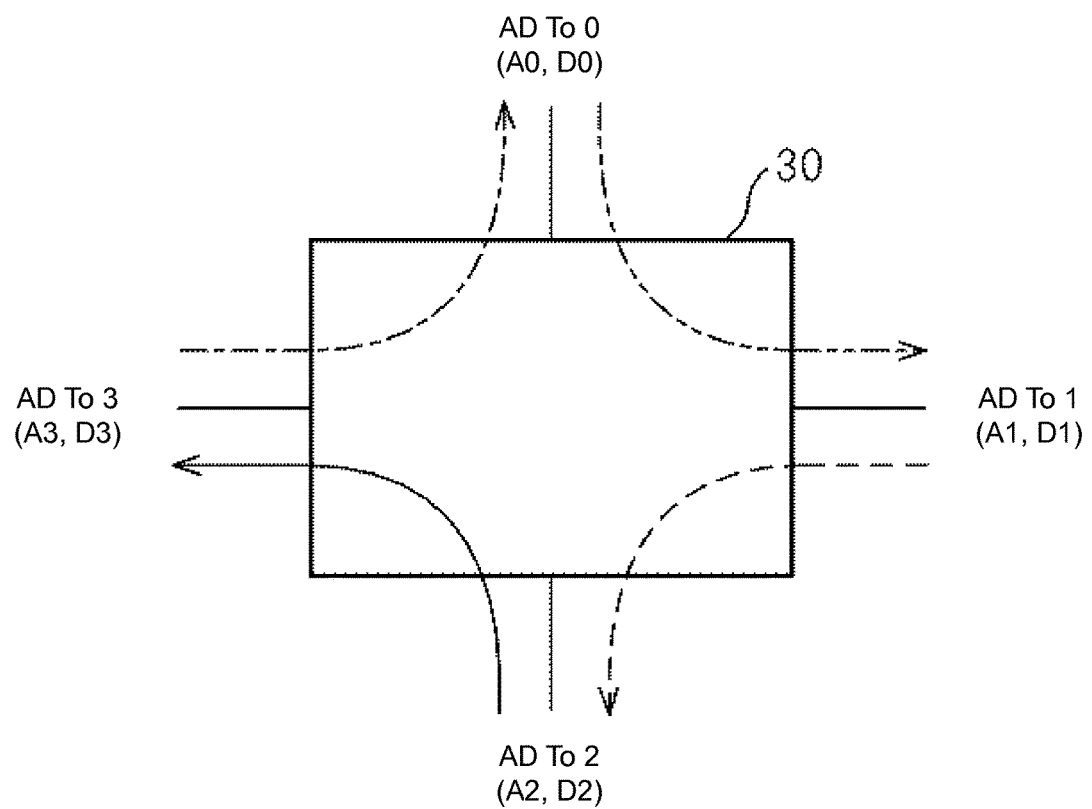
FIG. 20 is a diagram illustrating an example of a connection element realized by an MLUT having four AD pairs.

FIG. 20 is a diagram illustrating an example of a connection element realized by an MLUT having four AD pairs, namely an AD pair 0, an AD pair 1, an AD pair 2, and an AD pair 3. AD0 has the logic address input LA line A0 and the logic operation data line D0. AD1 has the logic address input LA line A1 and the logic operation data line D1. AD2 has the logic address input LA line A2 and the logic operation data line D2. Finally, AD3 has the logic address input LA line A3 and the logic operation data line D3. In FIG. 20, the double-dot-dash line indicates the flow of a signal inputted to the logic address input LA line A0 of the AD pair 0 and outputted to the logic operation data line D1 of the AD pair 1. The broken line indicates the flow of a signal inputted to the logic address input LA line A1 of the AD pair 1 and outputted to the logic operation data line D2 of the AD pair 2. The solid line indicates the flow of a signal inputted to the logic address input LA line A2 of the AD pair 2 and outputted to the logic operation data line D3 of the AD pair 3. The single-dot-dash line indicates the flow of a signal inputted to the logic address input LA line A3 of the AD pair 3 and outputted to the logic operation data line D0 of the AD pair 0.

Although the MLUT 30 has four AD pairs in FIG. 20, the number of AD pairs is not particularly limited to four.

C. Combination Function of Logic Element and Connection Element

Figure 21:
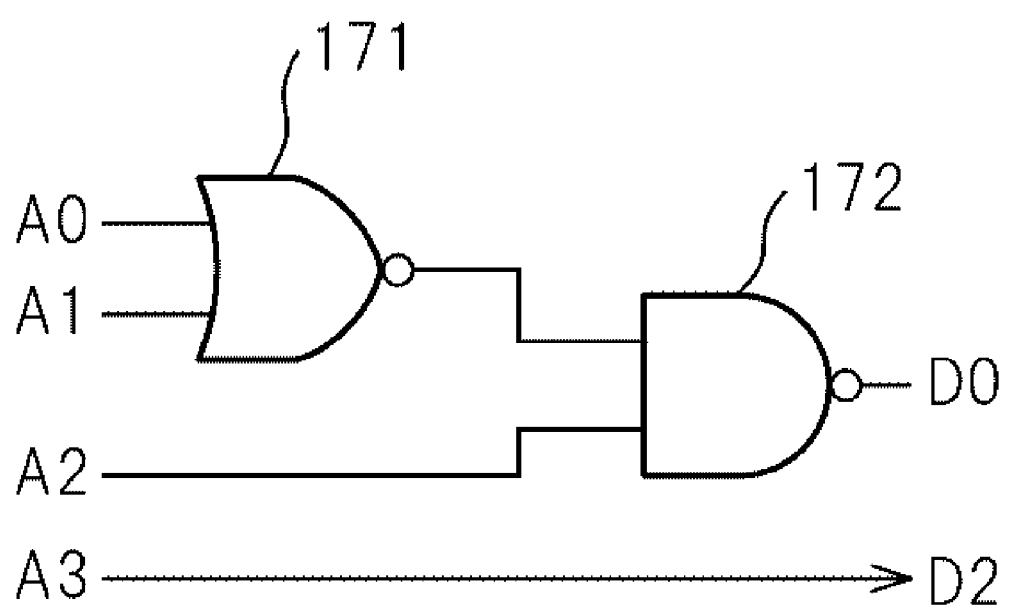
FIG. 21 is a diagram illustrating an example in which a single MLUT operates as a logic element and a connection element.

FIG. 21 is a diagram illustrating an example of a single MLUT operating as a logic element and a connection element. In the example illustrated in FIG. 21, the logic address input LA lines A0 and A1 serve as inputs of a dual-input NOR circuit 121, the output of the dual-input NOR circuit 121 and the logic address input LA line A2 serve as inputs of a dual-input NAND circuit 122, and the output of the dual-input NAND circuit 122 is outputted to the logic operation data line D0, thus configuring the logic circuit. At the same time, the signal of the logic address input LA line A3 is outputted to the logic operation data line D2, thus configuring the connection element.

FIG. 22 illustrates a truth table of the logic element and the connection element illustrated in FIG. 21. The logic operation of FIG. 21 uses the three inputs D0 to D3 and the single output D0 as an output. On the other hand, the connection element of FIG. 22 realizes a connection element that outputs the signal of the input A3 to the output D2.

Figure 23:
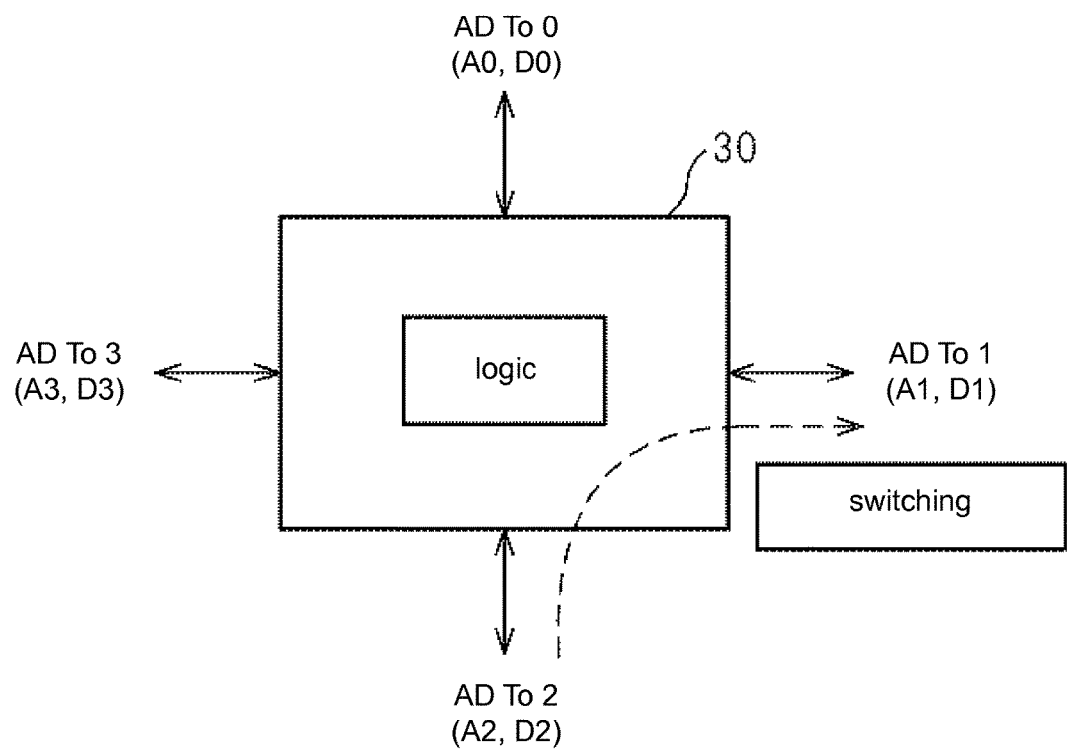
FIG. 23 is a diagram illustrating an example of logic operations and a connection element realized by an MLUT having AD pairs.

FIG. 23 is a diagram illustrating an example of a logic operation and a connection element realized by an MLUT having four AD pairs, namely AD0, AD1, AD2, and AD3. Like the MLUT illustrated in FIG. 20, AD0 has the logic address input LA line A0 and the logic operation data line D0. AD1 has the logic address input LA line A1 and the logic operation data line D1. AD2 has the logic address input LA line A2 and the logic operation data line D2. Finally, AD3 has the logic address input LA line A3 and the logic operation data line D3. As described above, the MLUT 30 implements two operations, namely a three-input, one-output logic operation and a one input, one output connection element, using a single MLUT 30. Specifically, the logic operation uses the logic address input LA line A0 of the AD pair 0, the logic address input LA line A1 of the AD pair 1, and the logic address input LA line A2 of the AD pair 2 as inputs. The address line of the logic operation data line D0 of the AD pair 0 is used as an output. Meanwhile, as indicated by the broken line, a signal inputted to the logic address input LA line A3 of the AD pair 3 is outputted to the logic operation data line D2 of the AD pair 2 in the connection element.

Figure 24:
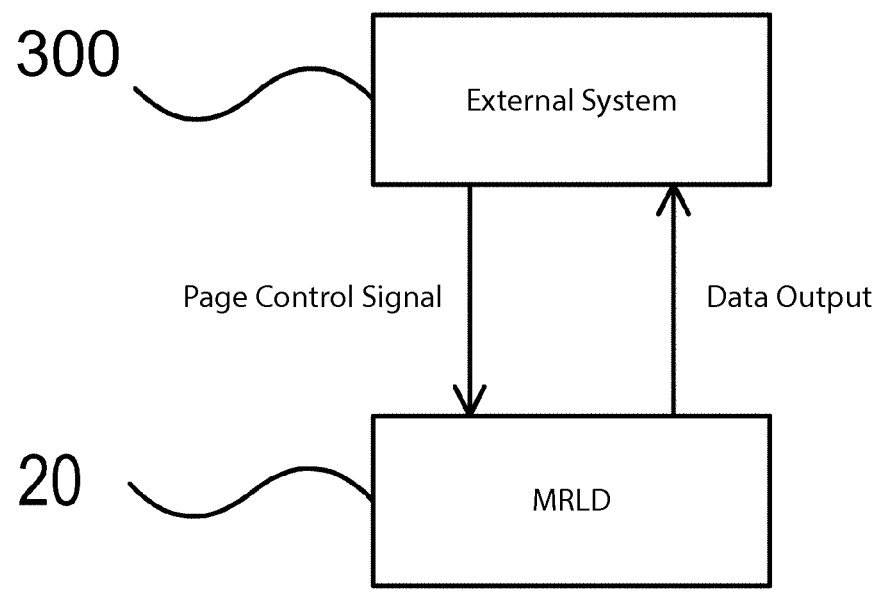
FIG. 24 is a conceptual diagram illustrating an example of connections between an external system and an MRLD.

FIG. 24 is a conceptual diagram illustrating an example of a connection between an external system and an MRLD. An external system 300 is a device implemented as an information processing apparatus or a SoC. The external system 300 is connected to the MRLD 20 illustrated in FIG. 9, takes a data output from the MRLD 20, carries out a logic operation for determining a page switch, and then outputs page switch signals to the addresses A8 to A15 over that connection. By providing a SoC, the external system can realize a device having a higher level of functionality along with the MRLD 20.

7. Method of Generating Truth Table Data

The truth table data applied in the reconfigurable semiconductor devices described using Embodiments 1 and 2 is generated by an information processing apparatus executing a software program for logic configuration.

Figure 25:
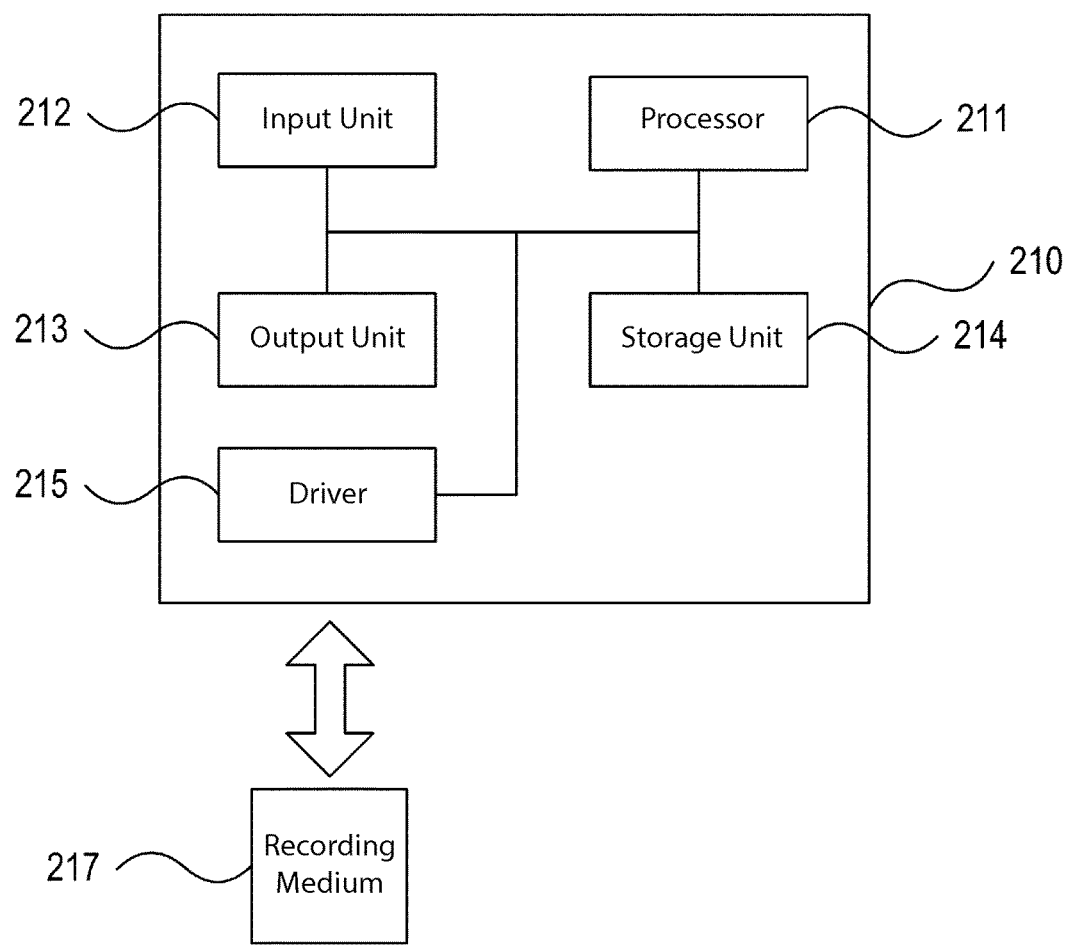
FIG. 25 illustrates an example of the hardware configuration of an information processing apparatus.

FIG. 25 illustrates an example of the hardware configuration of an information processing apparatus. An information processing apparatus 210 includes a processor 211, an input unit 212, an output unit 213, a storage unit 214, and a drive device 215. The processor 211 stores, in the storage unit 214, arrangement/wiring software inputted to the input unit 212, circuit description language, written in the C language or hardware description language (HDL), for designing integrated circuits, and truth table data generated by executing the stated software. The processor 211 executes the arrangement/wiring software, carries out an arrangement/wiring process, described below, on the circuit description stored in the storage unit 214, and outputs the truth table data to the output unit 213. The output unit 213 can be connected to a reconfigurable semiconductor device 20 (not shown in FIG. 25), and the processor 211 executes a logic configuration process and writes the generated truth table data into the reconfigurable semiconductor device 20 via the output unit 213. The output unit 213 may be connected to an external network. In this case, the logic configuration software program is sent and received over the network. The drive device 215 is a device that reads and writes to and from a storage medium 217 such as a DVD (Digital Versatile Disc), a flash memory, or the like, for example. The drive device 215 includes a motor for rotating the storage medium 217, a head that reads and writes data to and from the storage medium 217, and so on. Note that the storage medium 217 can store the logic configuration program or the truth table data. The drive device 215 reads out the program from the storage medium 217 set therein. The processor 211 stores the program or truth table data read out by the drive device 215 in the storage unit 214.

By loading the truth table data into the semiconductor device 20, the functions of the logic element and/or the connection element are constructed through a specific technique in which the truth table data and hardware resources run cooperatively. The truth table data can also be called data having a structure indicating the logical structure of a truth table.

The embodiments described thus far are given merely as typical examples, and combinations of the constituent elements of the respective embodiments, changes, and variations thereon will be clear to those skilled in the art; furthermore, it will be clear to those skilled in the art that a variety of changes can be made to the foregoing embodiments without departing from the spirit of the present invention and the scope of the invention as denoted in the scope of claim. In particular, in the logic or connection operations of the MRLD, using a bidirectional MLUT for multidirectional MLUT operations can be implemented as a variation on the embodiments.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A reconfigurable operational amplifier, comprising:
a first signal input terminal;
a second signal input terminal;
an output terminal;
an operational amplifier having a non-inverting input, an inverting input, and an output;
a negative feedback circuit path from the output of the operational amplifier to said inverting input of the operational amplifier;
a first input circuit path from the first signal input terminal to the non-inverting input of the operational amplifier;
a second input circuit path from the second signal input terminal to the inverting input of the operational amplifier;
an output circuit path from the output of the operational amplifier to the output terminal; and
a plurality of logic units,
wherein one or more of said plurality of logic units are provided in at least one of the negative feedback circuit path, the first input circuit path, the second input circuit path, and the output circuit path, and
wherein each of said plurality of logic units is a multi-lookup table.

2. The reconfigurable operational amplifier according to claim 1, further comprising:
a resistor in at least one path among the negative feedback circuit path, the first input circuit path, the second input circuit path, and the output circuit path;
wherein in said at least one path in which said resistor is provided, said one or more of the plurality of logic units are provided so as to selectively bypass or connect said resistor.

3. The reconfigurable operational amplifier according to claim 2,
wherein said resistor is provided in a plurality in series or in parallel to each other in said at least one path.

4. The reconfigurable operational amplifier according to claim 1,
wherein each of said plurality of logic units includes a plurality of address lines, a plurality of data lines, a memory unit, and an address decoder that decodes an address signal and outputs a decoded signal to said memory unit.

5. The reconfigurable operational amplifier according to claim 1,
wherein said plurality of logic units and said operational amplifier are packaged within a same chip package.

6. A reconfigurable operational amplifier device, comprising:
a plurality of the reconfigurable operational amplifiers according to claim 1; and
logic units that connect said plurality of reconfigurable operational amplifiers to one another.

7. A reconfigurable operational amplifier device, comprising:
a plurality of the reconfigurable operational amplifiers according to claim 1; and
transistors that connect said plurality of reconfigurable operational amplifiers to one another.

8. The reconfigurable operational amplifier according to claim 1, wherein said one or more of said plurality of logic units are provided in each of the negative feedback circuit path, the first input circuit path, the second input circuit path, and the output circuit path.

9. The reconfigurable operational amplifier according to claim 1, further comprising:
a capacitor in at least one path among the negative feedback circuit path, the first input circuit path, the second input circuit path, and the output circuit path;
wherein in said at least one path in which said capacitor is provided, said one or more of the plurality of logic units are provided so as to selectively bypass or connect said capacitor.

10. The reconfigurable operational amplifier according to claim 1, wherein said one or more of said plurality of logic units are provided in each of the negative feedback circuit path, the first input circuit path, the second input circuit path, and the output circuit path,
wherein said reconfigurable operational amplifier further comprises:
a capacitor in at least one path among the negative feedback circuit path, the first input circuit path, the second input circuit path, and the output circuit path; and
a resistor in at least one path among the negative feedback circuit path, the first input circuit path, the second input circuit path, and the output circuit path,
wherein in said at least one path in which said capacitor is provided, said one or more of the plurality of logic units are provided so as to selectively bypass or connect said capacitor, and
wherein in said at least one path in which said resistor is provided, said one or more of the plurality of logic units are provided so as to selectively bypass or connect said resistor.

11. A reconfigurable operational amplifier device, comprising:
a plurality of the reconfigurable operational amplifiers, each of the plurality of reconfigurable operational amplifier comprising:
a first signal input terminal;
a second signal input terminal;
an output terminal;
an operational amplifier having a non-inverting input, an inverting input, and an output;
a negative feedback circuit path from the output of the operational amplifier to said inverting input of the operational amplifier;
a first input circuit path from the first signal input terminal to the non-inverting input of the operational amplifier;
a second input circuit path from the second signal input terminal to the inverting input of the operational amplifier;
an output circuit path from the output of the operational amplifier to the output terminal; and
a plurality of logic units,
wherein one or more of said plurality of logic units are provided in at least one of the negative feedback circuit path, the first input circuit path, the second input circuit path, and the output circuit path; and
logic units that connect said plurality of reconfigurable operational amplifiers to one another.

12. A reconfigurable operational amplifier device, comprising:
a plurality of the reconfigurable operational amplifiers each of the plurality of reconfigurable operational amplifier comprising:

a first signal input terminal;
a second signal input terminal;
an output terminal;
an operational amplifier having a non-inverting input, an inverting input, and an output;
a negative feedback circuit path from the output of the operational amplifier to said inverting input of the operational amplifier;
a first input circuit path from the first signal input terminal to the non-inverting input of the operational amplifier;
a second input circuit path from the second signal input terminal to the inverting input of the operational amplifier;
an output circuit path from the output of the operational amplifier to the output terminal; and
a plurality of logic units,
wherein one or more of said plurality of logic units are provided in at least one of the negative feedback circuit path, the first input circuit path, the second input circuit path, and the output circuit path; and
transistors that connect said plurality of reconfigurable operational amplifiers to one another.

13. A reconfigurable operational amplifier, comprising:
a first signal input terminal;
a second signal input terminal;
an output terminal;
an operational amplifier having a non-inverting input, an inverting input, and an output;
a negative feedback circuit path from the output of the operational amplifier to said inverting input of the operational amplifier;
a first input circuit path from the first signal input terminal to the non-inverting input of the operational amplifier;
a second input circuit path from the second signal input terminal to the inverting input of the operational amplifier;
an output circuit path from the output of the operational amplifier to the output terminal; and
a plurality of logic units,
wherein one or more of said plurality of logic units are provided in each of the negative feedback circuit path, the first input circuit path, the second input circuit path, and the output circuit path.

14. A reconfigurable operational amplifier, comprising:
a first signal input terminal;
a second signal input terminal;
an output terminal;
an operational amplifier having a non-inverting input, an inverting input, and an output;
a negative feedback circuit path from the output of the operational amplifier to said inverting input of the operational amplifier;
a first input circuit path from the first signal input terminal to the non-inverting input of the operational amplifier;
a second input circuit path from the second signal input terminal to the inverting input of the operational amplifier;
an output circuit path from the output of the operational amplifier to the output terminal;
a plurality of logic units; and
a capacitor in at least one path among the negative feedback circuit path, the first input circuit path, the second input circuit path, and the output circuit path,
wherein one or more of said plurality of logic units are provided in said at least one path in which said capacitor is provided so as to selectively bypass or connect said capacitor.

15. A reconfigurable operational amplifier, comprising:
a first signal input terminal;
a second signal input terminal;
an output terminal;
an operational amplifier having a non-inverting input, an inverting input, and an output;
a negative feedback circuit path from the output of the operational amplifier to said inverting input of the operational amplifier;
a first input circuit path from the first signal input terminal to the non-inverting input of the operational amplifier;
a second input circuit path from the second signal input terminal to the inverting input of the operational amplifier;
an output circuit path from the output of the operational amplifier to the output terminal;
a plurality of logic units;
a capacitor in at least one path among the negative feedback circuit path, the first input circuit path, the second input circuit path, and the output circuit path; and
a resistor in at least one path among the negative feedback circuit path, the first input circuit path, the second input circuit path, and the output circuit path,
wherein one or more of said plurality of logic units are provided in each of the negative feedback circuit path, the first input circuit path, the second input circuit path, and the output circuit path,
wherein in said at least one path in which said capacitor is provided, said one or more of the plurality of logic units are provided so as to selectively bypass or connect said capacitor, and
wherein in said at least one path in which said resistor is provided, said one or more of the plurality of logic units are provided so as to selectively bypass or connect said resistor.

* * * * *